US006995119B2

(12) United States Patent (10) Patent No.: US 6,995,119 B2
Dunand (45) Date of Patent: Feb. 7, 2006

(54) SUPERCONDUCTING MG-MGB$_2$ AND RELATED METAL COMPOSITES AND METHODS OF PREPARATION

(75) Inventor: David C. Dunand, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 10/680,639

(22) Filed: Oct. 7, 2003

(65) Prior Publication Data

US 2004/0159371 A1 Aug. 19, 2004

Related U.S. Application Data

(62) Division of application No. 10/160,805, filed on May 31, 2002, now Pat. No. 6,630,427.

(60) Provisional application No. 60/295,447, filed on Jun. 1, 2001.

(51) Int. Cl.
*C04B 35/58* (2006.01)
(52) U.S. Cl. .................. 505/124; 428/539.5; 75/244
(58) Field of Classification Search ................ 75/244; 505/124; 428/539.5
See application file for complete search history.

(56) References Cited

U.S. PATENT DOCUMENTS

| | | | |
|---|---|---|---|
| 3,894,850 A | 7/1975 | Kovalchuk et al. | |
| RE28,983 E | 9/1976 | Sindzingre et al. | |
| 4,411,712 A | 10/1983 | Marancik | |
| 4,855,263 A | 8/1989 | Kawasaki et al. | |
| 5,511,603 A | 4/1996 | Brown et al. | |
| 5,696,057 A * | 12/1997 | McArdle | 505/452 |
| 6,586,370 B1 * | 7/2003 | Holcomb | 505/236 |

FOREIGN PATENT DOCUMENTS

WO    WO 02/064859 A2    8/2002

OTHER PUBLICATIONS

Zhu, Y. et al., "Microstructure and Structural Defects in MgB2 Superconductor," *Physica C: Superconductivity and Its Applications*, Aug. 2001, 356(4), p. 239-53 (Abstract only).
Giunchi, Giovanni, "High Density MgB$_2$ Obtained by Reactive Liquid Mg Infiltration," Los Alamos National Laboratory, Preprint Archive, Condensed Matter, 1-8, arXiv:cond-mat/0208040, 2002.
Rafailov, P. M., et al., "The Raman Spectra of MgB$_2$ and its Potential Impurity Phases," *Physica Status Solidi B:Basic Research*, Jun. 11, 2001, 226(2), R9-R11.
Wilson, et al. "Reaction of magnesium boride particles in mechanically alloyed Ti-4wt%MgB$_2$", *Journal of Materials Science*, 2001, p. 67-75, vol. 36, Kluwer Academic Publishers.

Sharoni, et al. "Spatial variations of the superconductor gap structure in MgB$_2$/A1 composite", *Institute of Physics Publishing*, Apr. 26, 2001, p. L503-L508, Matter 13, IOP Publishing Ltd.
Soltanian, et al. "High-transport critical current density above 30 K in pure Fe-clad MgB$_2$ tape", *Physica C*, 2001, p. 84-90, Elsevier Science B.V.
Wang, et al. "Very fast formation of superconducting of MgB$_2$/Fe wires with high $J_c$", *Physica C*,2001, p. 149-155, Elsevier Science B.V.
Kitaguchi, et al., "Strain effect in MgB$_2$/stainless steel superconducting tape", *Physica C*, 2001, p. 198-201, Elsevier Science B.V.
Song et al. "Single-filament composite MgB$_2$/stainless-steel ribbons by powder-in-tube process", *Physica C*, 2002, p. 21-26, Elsevier Science B.V.
Goldacker, et al. "Influence of mechanical reinforcement of MgB$_2$ wires on the superconducting properties", *Physica C*, 2002, p. 889-893, Elsevier Science B.V.
Tachikawa, et al. "Effects of metal powder addition on the critical current in MgB$_2$ tapes", *Physica C*, 2002, p. 108-112, Elsevier Science B.V.
Jin, et al. "High critical currents in iron-clad superconducting MgB$_2$ wires", *Nature*, May 31, 2001, p. 563-565, Macmillan Magazines Ltd.
Canfield, et al. "Superconductivity in Dense MgB$_2$ Wires", *Physical Review Letters*, Mar. 12, 2001, p. 2423-2426, vol. 86, No. 11, The American Physical Society 2001.
Martinez, et al. "Study of Ag and Cu/ MgB$_2$ powder-in-tube composite wires fabricated by in situ reaction at low temperatures", *Superconductor Science and Technologyl*, 2002, p. 1043-1047, IOP Publishing Ltd.
Pachla, et al. "Structural inhomogeneity of superconducting ex situ MgB$_2$/Cu wires made by the powder-in-tube technique", *Superconductor Science and Technology*, 2002, p. 1281-1287, IOP Publishing Ltd.
Kovac, et al. "Structure, grain connectivity and pinning of as-deformed commercial MgB$_2$ powder in Cu and Fe/Cu sheaths", *Superconductor Science and Technology*, 2002, p. 1127-1132, IOP Publishing Ltd.
Eisterer, et al. "Enhanced transport currents in Cu-sheathed MgB$_2$ wires", *Superconductor Science and Technology*, 2002, p. 1088-1091, IOP Publishing Ltd.
Suo, et al. "Fabrication and transport critical currents of multifilamentry MgB$_2$/Fe wires and tapes", *Superconductor Science and Technology*, 2002, p. 1058-1062, IOP Publishing Ltd.
Song, et al. "Anisotropic grain morphology, crystallographic texture and their implications for flux pinning mechanisms in MgB$_2$ pellets, filaments and thin films", *Superconductor Science and Technology*, 2002, p. 511-518, IOP Publishing Ltd.

(Continued)

Primary Examiner—Ngoclan T. Mai
(74) Attorney, Agent, or Firm—Reinhart Boerner VanDeuren

(57) ABSTRACT

Superconducting phases comprising magnesium diboride related composites and methods of preparation.

15 Claims, 17 Drawing Sheets

OTHER PUBLICATIONS

Wu, et al. "Superconducting $MgB_2$ Nanowires", *Advanced Materials*, Oct. 2, 2001, vol. 13, No. 19, p. 1487-1489, WILEY-VCH Verlag GmbH.

Cunningham, et al. "Synthesis and processing of $MgB_2$ powders and wires", *Physica C*, 2001, p. 5-10, Elsevier Science B.V.

Louis, et al. "Pressure infiltration of packed ceramic particulates by liquid metals", *Acta Materialia*, Dec. 10, 1999, p. 4461-4479.

Unknown. "Transactions of the Indian", *Institute of Metals*, Dec. 1997, p. 665-674.

Glowacki, et al. "Superconductivity of powder-in-tube MgB2 wires", *Superconductor Science & Technology*, Apr. 2001, p. 193-199.

Zhang, et al. "Structure and superconductivity of Mg(B1-xCx)(2) compounds", *Chinese Physics*, Apr. 2001, p. 335-337.

Goldacker, et al. "High transport currents in mechanically reinforced $MgB_2$ wires", *Superconductor Science and Technology*, 2001, p. 787-793, IOP Publishing Ltd.

Fujii, et al. "Influence of $MgB_2$ powder quality on the transport properties of Cu-sheathed $MgB_2$ tapes", *Physica C*, 2001, p. 237-242, Elsevier Science B.V.

Zhou, et al. "Single- and multi-filamentary Fe-sheathed $MgB_2$ wires", *Physica C*, 2002, p. 349-354, Elsevier Science B.V.

Kumakura, et al. "Microstructure and superconducting properties of powder-in-tube processed $MgB_2$ tapes", *Physica C*, 2002, p. 93-97, Elsevier Science B.V.

Michaud, Liquid-State Processing, Thesis, Department of Materials Science and Engineering, Massachusetts Institute of Technology, Cambridge, MA, 1991, pp. 3-22.

Mortensen, et al., Solidification processing of metal matrix, International Materials Reviews, vol. 37, No. 3, 1992, pp. 101-128.

* cited by examiner

SUPERCONDUCTING MG-MGB$_2$ AND RELATED METAL COMPOSITES AND METHODS OF PREPARATION

IDENTIFICATION OF RELATED APPLICATIONS

This application is a division of and claims priority benefit from application Ser. No. 10/160,805 filed on May 31, 2002, issued as U.S. Pat. No. 6,630,427 on Oct. 7, 2003, which claims priority benefit from U.S. provisional patent application Ser. No. 60/295,447 filed Jun. 1, 2001, each of which is incorporated herein by reference in its entirety.

BACKGROUND OF INVENTION

Magnesium diboride (MgB$_2$) has recently been found to be superconducting at the critical temperature $T_c$ of ~40 K, much higher than the best low-temperature intermetallic superconductors ($T_c$~23 K). See, Nagamatsu J, Nakagawa N, Muranaka T, et al., Superconductivity at 39 K in magnesium diboride, NATURE 410 (6824): 63–64 Mar. 1, 2001. While its critical temperature is lower than for the cuprate superconductors, MgB$_2$ is a classical superconductor behaving according to the BCS theory, like the existing low-temperature intermetallic superconductors. Unlike cuprates, however, MgB$_2$ shows excellent conduction across grain boundaries and it is a simple, stoichiometric compound, very easy and inexpensive to synthesize. In the few months since discovery of its superconductive properties, MgB$_2$ has generated a tremendous amount of research and interest.

Several factors would, however, seem to preclude widespread use of MgB$_2$ as a superconducting material. Because it is a brittle ceramic, MgB$_2$ is difficult to use in bulk form as a single phase. For instance, any cracks in the diboride phase will interrupt the superconducting pathway. The ceramic could be embedded in a tough, robust metallic matrix. This approach has been used with brittle cuprate superconductors (typically mixed and sintered with silver) and for the brittle, low-temperature intermetallic superconductor Nb$_3$Sn (encapsulated in copper and cold-drawn as a Nb precursor). Such an approach would be difficult to achieve with MgB$_2$.

The consensus is that the prior art relating to diboride superconducting materials has associated with it a number of problems and deficiencies, most of which relate to the structural and/or mechanical limitations of the superconducting phase. Accordingly, there is a need for one or more process and/or fabrication techniques, as well as related compositions of matter, to better utilize and benefit from the superconductivity of such materials.

SUMMARY OF THE INVENTION

Figure 1:
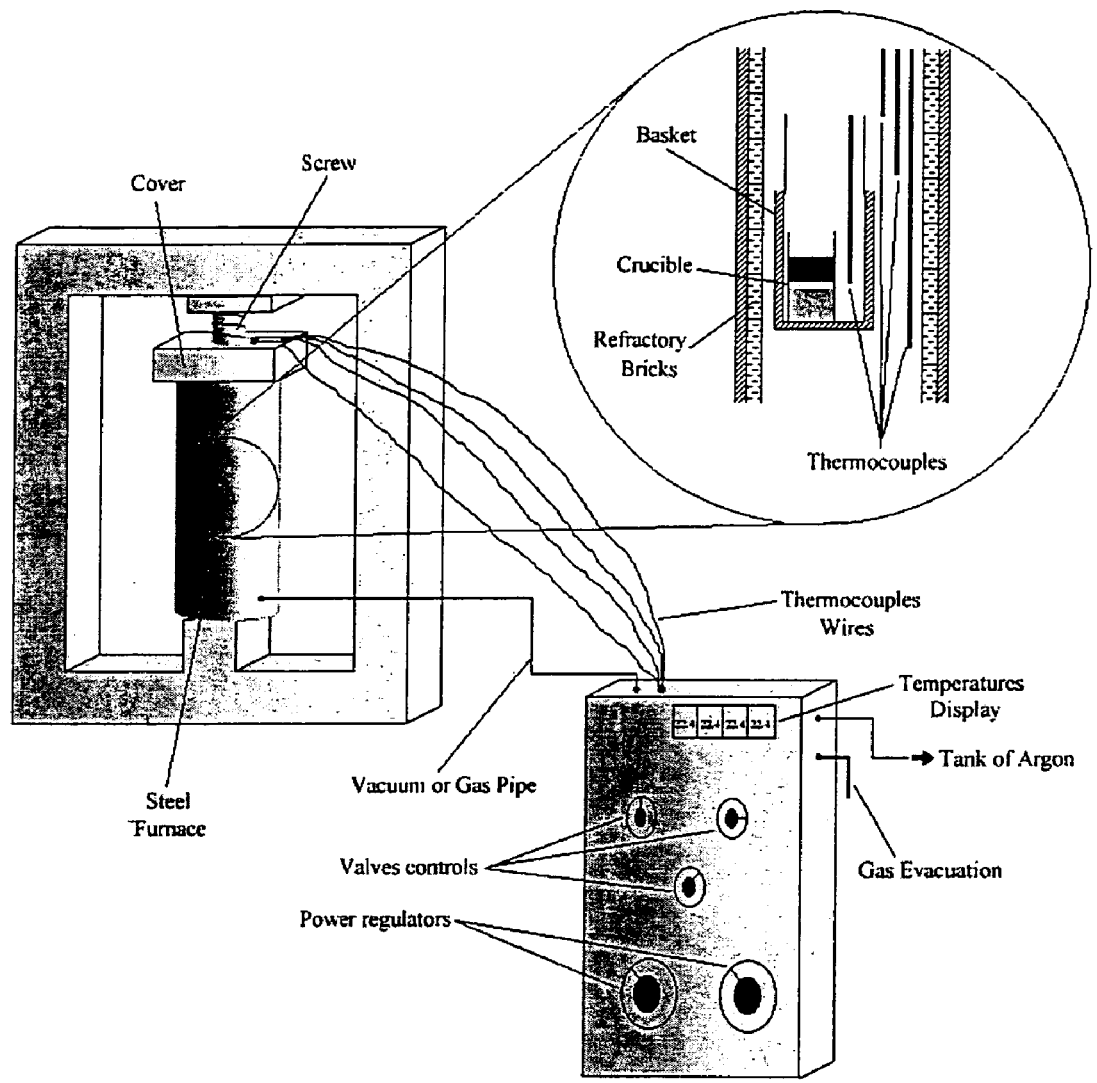
FIG. 1: Schematic description of an infiltration system of the type useful in accordance with the methods of this invention.

In light of the foregoing, it is an object of the present invention to provide magnesium diboride materials and/or composites and methods for their production, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide one or more novel superconducting material/composite structures utilizing MgB$_2$ as a superconducting phase, such phase varied as described more fully, below. It can also be an object of the present invention to provide such materials/composites for use in non-superconducting contexts, as described elsewhere herein.

It can also be an object of the present invention to provide a superconducting material/composite comprising a metallic component, the identity of which can be determined according to choice of superconducting phase and desired structural and/or physical composite properties.

In conjunction with the preceding objectives, it can also be an object of the present invention to provide more particularly, an MgB$_2$ material/composite having properties or structural characteristics sufficient to beneficially utilize the new found superconductivity of MgB$_2$.

It can also be an object of the present invention to provide an efficient, economical and facile method for preparing such superconducting materials and/or composite structures, such materials/composites demonstrating a superconductive phase with performance comparable to the isolated corresponding superconducting phase or component thereof. Accordingly, it is a related object of this invention to provide a material/composite with a superconducting magnesium-boride (Mg—B) component as the reaction product of one or more suitable magnesium or boride precursors.

Other objects, features, benefits and advantages of the present invention will be apparent from this summary and its descriptions of various preferred embodiments, and will be readily apparent to those skilled in the art having knowledge of various superconducting materials, composites and processes for their production and/or fabrication. Such objects, features, benefits and advantages will be apparent from the above as taken into conjunction with the accompanying examples, data and all reasonable inferences to be drawn therefrom.

The present invention relates to a novel group of composites and/or materials comprising a superconducting phase and a metallic phase and/or matrix, such composites/materials prepared efficiently and economically as compared to cuprate composites of prior art. Preferred composites/materials utilize MgB$_2$ and have critical temperatures (T$_c$) of about 39K, much higher than existing low-temperature intermetallic superconducting composites, thereby reducing refrigeration costs. The superconducting properties of MgB$_2$ can hereby be provided in the context of a tough, ductile and robust metallic phase or matrix, the resulting composite/material also providing, as needed, good thermal conductivity, strength, durability, processability and resistance to environmental degradation.

In part, the present invention is an Mg—B superconducting material and composite structure. The material/composite structure includes, without limitation, an Mg—B superconducting phase of magnesium and boron, but optionally including other elemental components, and a metallic phase support and/or matrix for the superconducting phase. In preferred embodiments, the superconducting phase is MgB$_2$ or can comprise, within the broader aspects of this invention, a superconducting phase with the same or related crystallographic structure as MgB$_2$ with comparable superconductivity properties. Alternatively, the superconducting phase can be a solid solution between MgB$_2$ and another component, such as but not limited to aluminum diboride, and/or such that magnesium and boron provide by weight an elemental majority in a corresponding multi-element phase. Other such phases are consistent with known relationships in the field of superconductivity, incorporating other elements by way of changing lattice configurations or spacing and/or improving superconducting properties. Ternary and higher multi-element phases where one or both of the base Mg and B elements are at least partially substituted and/or doped with other elements (e.g., $Mg_{1-x}Cu_xB_2$ or $MgB_{2-x}C_x$) are contemplated within the scope of this invention.

Regardless of the identity of the superconducting phase, the metallic component of the present material/composite structure can be selected from those metals or their alloys in accordance with this invention and/or guidelines provided herein. Depending upon the superconducting phase, useful metals include Cu, Au, Ag, Al, Mg, Zn, Pb, Cd, Sn, Bi, Ga, Hg and In. Alloys of each such metal can also be utilized. In highly preferred embodiments, the present invention includes magnesium metal, for reasons relating to chemical inertness with $MgB_2$ and as more fully described below.

Irrespective of metallic phase/matrix, the superconducting phase of this invention has a volume fraction sufficient to provide superconductivity at an operative critical temperature. In preferred embodiments, the superconducting phase volume fraction is greater than or equal to about 19%. Lower volume fractions are possible for superconducting applications where no current must be carried over large distances, such as where magnetic properties are of interest. In preferred embodiments, the volume fraction of the superconducting phase is between about 20% and about 90%, the upper limit relating more so to a preferred method of preparing the material/composite structure, as described more fully below. Likewise, particle size distribution for the superconducting phase can be limited by various process parameters relating to the methodologies of this invention.

In part, the present invention is, therefore, a method of preparing superconducting materials and composite structures, such as those described above and/or as can be characterized as provided elsewhere herein, by critical current, temperature, magnetic field or other such superconductive performance properties or parameters. The inventive method includes providing a particulate ceramic component operative at a critical temperature as a superconductor of current, such component arranged to have a predetermined or preformed configuration with porosity; and introducing a melted or liquid metallic component into the porosity of the preconfigured/preformed ceramic component. If necessary, application of suitable pressure assists movement or infiltration by the liquid metal component throughout the porosity defined by the particle interstitial spaces. Solidification of the metal, upon cooling, provides the resulting superconducting material and composite structure. Various possible and/or preferred ceramic and metallic components are as described more fully above. In particular, an $MgB_2$ composite superconductive at a temperature at least about 35 K and demonstrating various other such performance properties is obtainable or can be prepared by such a process.

With regard to the ceramic component, particle size and/or distribution can vary depending upon the synthetic route or commercial source utilized. For instance, a preferred $MgB_2$ ceramic superconducting phase can have a particle size between about 5 and about 100 microns, the distribution of which is relatively unrestricted but for pressures employed to infiltrate liquid metal. Typically, finer particles will require higher infiltration pressures, the range of which would be understood by those skilled in the art made aware of this invention.

Alternatively, either alone or in the presence of ceramic particles, ceramic fibers, platelets or sponge structures of various lengths, configuration and width/diameter, whether or not sheathed, can be included in the preformed configuration. Such fibers, particles, or platelets, if sheathed as understood by those skilled in the art, can allow for the use of a liquid metal with less concern about ceramic phase reactivity. For instance, if an iron sheath is utilized in conjunction with $MgB_2$ fibers (short or long, aligned or unaligned), liquid copper metal can be utilized as the metallic component as it has low reactivity with iron. Other such sheathed or coated ceramic fibers, particles, or platelets, are known to those skilled in the art and can be utilized as described herein, either alone or with various ceramic particles, to provide various other compositions in accordance with the superconducting materials and composite structures described above.

Analogously, a preform consisting of ceramic/superconducting powders and/or fibers can be prepared using non-superconducting powders, platelets or fibers including, but not limited to, iron, boron, alumina or graphite. Infiltration by liquid metal, with subsequent cooling, provides a superconducting composite structure reinforced with the non-superconducting component. A non-superconducting particulate material can be used to control the volume fraction or connectivity of the superconducting component or to otherwise affect electrical, thermal and/or structural properties of the resulting composite. For instance, strength, stiffness and durability of a superconducting composite can be enhanced through preform incorporation of graphite, steel or related metal fibers.

Other variations of the present methodology are possible by way of providing the corresponding materials and/or composite structures. For instance, and without limitation, the superconducting phase can be prepared in situ, by reaction, at least partially or completely, of a liquid metallic component with a suitable phase precursor. With consideration of the process parameters described above, a configured preform of boron powder can be treated with excess liquid magnesium to provide a superconducting $Mg/MgB_2$ material and composite structure. Such reaction with the precursor component can be achieved during infiltration or, alternatively, upon heat treatment at a time later under temperatures suitable for the desired transformation. In the diboride context, a suitable precursor can include either boron or a boron-containing compound. Boron oxide can be infiltrated with liquid magnesium to provide the desired magnesium diboride superconducting phase together with magnesium oxide in a magnesium phase or matrix. A sufficient excess of magnesium can facilitate the extent of reaction and provide the resulting composite with the desired structural and/or physical properties.

Likewise, excess precursor can also provide corresponding beneficial properties attributable to unreacted precursor such as boron or boron oxide. The resulting composite does not contain any unreacted metal after reaction and has a boron phase volume fraction of 100%. Alternatively, the amount or quantity of magnesium can be adjusted to react completely with boron, resulting in a single-phase $MgB_2$ material. Accordingly, the present invention includes a method of using a metallic component to synthesize or form a corresponding superconducting phase and/or fabricate a composite thereof.

This in situ modification can be further varied, as described above, through use of amorphous or crystalline boron or boron-containing compounds, either alone or in conjunction with corresponding fibrous materials. Likewise, while the metallic component can be magnesium or an alloy thereof, other liquid metal components, as well as non-superconducting phases, can be utilized with consideration of the aforementioned concerns about reactivity. Other matrix or metallic phase components can include liquid ceramic or liquid polymer materials. Glasses include, but are not limited to, silica-based glasses such as borosilicate glass, soda-lime glass and leaded glass. Thermoset (epoxy, phenolics, polyesters) and thermoplastic polyethylene, polypropylene, polyamides, polyvinyl chloride, polystyrene, polycarbonates) polymers are among those which can also be used. Metal or carbon particles (or fibers) can be made part of these glass or polymer matrices to increase thermal and electrical conductivity. These additives can be added in the $MgB_2$ preform and infiltrated by the melt or suspended in the liquid matrix and entrained into the preform during the infiltration. Polymer infiltration, for instance, would be more facile, with lower temperatures and reactivities, than the metals of this invention. Mechanical advantages can be enhanced, and conductivities improved as the level of such inclusions are increased. Further, glass composites can be drawn as fibers. The resulting superconducting materials and composite structures are contemplated within the broader aspects of this invention.

As a further variation on the methodology relating to this invention, materials and/or composite structures of the sort described above are obtainable or can be produced by incorporating powders or fibers of a superconducting phase component with a suitable metallic component (powder or particulate) and compacting the resulting mixture or blend into a dense composite. Compaction is achieved at temperatures low-enough to sufficiently maintain the phases as solids and/or non-reactive, but high enough to insure sufficient bonding between the metallic phase particulates. In preferred embodiments, the respective phases are chosen such that compaction results in the formation of $MgB_2$. Alternatively, such formation can be effected upon subsequent heat treatment of the resulting solid mixture. As discussed more fully herein, the superconducting phase can be a boron powder or fiber, or a boron-containing compound suitable as a precursor thereof. Likewise, preferred embodiments of this methodology can utilize magnesium powder, an excess thereof providing an $Mg/MgB_2$ composite. Further embodiments of this inventive aspect include either infiltration of a two-phase compacted composite with another suitable liquid metal, or the incorporation of additional powders/fibers (e.g., graphite fibers or MgO powders), which are non-reactive but afford enhancement of various structural or physical composite characteristics. Reference is made, more particularly, to example 8, below.

As mentioned above, in the context of preparing the materials/composites of this invention, the ceramic superconducting phase can be configured or preformed to provide a resulting composite structure having an architecture suitable for a particular end use application. As an additional aspect of this invention, the resulting material/composite can be extruded, forged, machined, or otherwise manipulated to provide an article of manufacture with the desired product configuration.

As discussed above, a composite of this invention includes a metal and/or metallic matrix component which, in addition to various structural benefits can serve as a heat and/or electric conductor. Heat is produced during superconduction because of current losses, e.g. at defects, and must be conducted to the cooled environment to prevent increasing the superconductor temperature above $T_c$ and subsequent loss of superconductivity. Having higher heat conductivity and capacity than typical ceramics, a metallic phase or matrix can act as a heat sink and conductor to prevent "hot-spots". Alternatively, if there is a local breakdown of superconductivity, the metallic component can conduct current until the superconductor is cooled back below $T_c$. Also, if the superconducting path is interrupted, the metallic phase/matrix can provide a conductive bridge.

Thus, a metallic component for a superconductor composite of this invention has, preferably, good toughness/ductility, high thermal and electrical conductivity. Additional roles include: good corrosion resistance (if the superconducting phase can be degraded by the environment, as is the case for $MgB_2$ in water and many acids), high strength and stiffness (to prevent cracking of the superconducting ceramic phase with low tensile strength, e.g. due to magnetic forces or handling), low cost, and fastenability (by soldering, welding or mechanically). Also, the thermal expansion should be as close as possible to that of the reinforcement, if it is desired to limit mismatch stresses upon cooling from the processing temperature or to the operation temperature. Alternatively, a low-strength metal can plastically deform at low stresses, thus limiting the magnitude of internal stresses. However, if residual compressive stresses are desired in the superconducting ceramic phase to improve its resistance to cracking, then a metal with a high coefficient of thermal expansion and high yield stress can be chosen.

Processability is another issue germane to the superconducting composites of this invention. In particular, the phase or matrix should be chemically inert towards $MgB_2$ or other such superconducting phase during processing (and use) and should be easily amenable to forming an intimate contact therewith. Also, superconducting objects with complex shapes should be technically feasible as well as economically available. Meeting these concerns, the ceramic-metal composites of this invention can be prepared by liquid infiltration: for instance, an evacuated solid ceramic preform is infiltrated (typically by applying pressure) by the matrix in liquid form, which is then solidified. This method has as advantage the low cost and near-net shape capability of casting.

With reference to a preferred superconducting phase, $MgB_2$ is known to decompose at temperatures as low as 800° C. into Mg and higher (non-superconducting) borides. The rate becomes fast above about 1100° C., which can limit certain embodiments. Accordingly, pure metals with a melting point which can be used to infiltrate $MgB_2$, without substantial thermal degradation or decomposition, include—in order of decreasing melting point—Cu, Au, Ag, Al, Mg, Zn, Pb, Cd, Sn, Bi, In, Ga, and Hg (alloys of each such metal, e.g., brass are also possible, as well as low-melting alloys of other metals with high melting points, e.g., a Ni—Si or Ni—Ti eutectic). Strength and stiffness also scale with melting point. Of the aforementioned metals, each of Pb, Cd, Sn, In, Ga and Hg have too low thermal and electrical conductivities to be an optimal matrix choice, but their low reactivity, price and melting temperature are attractive. Au is very expensive, as is Ag, and Cu has a melting point which may be too high, but these three metals have very high thermal and electrical conductivities. Mg and Zn have lower ductility than the other cubic metals, but have sufficiently low melting points.

As indicated above, various metal components have one or more desirable properties, each of which must be factored in the context of a given superconducting phase and end use application. Even so, for superconducting applications a primary consideration is limited or no chemical reactivity between the metallic phase or matrix and the superconducting phase, limited to an extent beyond which would substantially degrade the superconducting phase and/or eventually destroy the corresponding properties. With regard to $MgB_2$, magnesium is one metal which meets this particular consideration. The Mg—B phase diagram shows that Mg and MgB$_2$ are at thermodynamic equilibrium with each other and have zero mutual solubility, leaving Mg representative of those metals useful for demonstration of a superconducting composite in accordance with this invention.

The Mg/MgB$_2$ system, a preferred composite of this invention, can be fabricated as follows: construction of a MgB$_2$ preform with minimum closed porosity (which would not be infiltrated by the liquid metal). Because liquid Mg does not react with MgB$_2$, it can be in direct contact with the preform before infiltration. The liquid Mg metal is induced or moved into the interstices of the preform, usually by applying pressure using suitable means such as, but not limited to, gas or a piston, with solidification forming a Mg/MgB$_2$ composite. The composite can then be subjected to other subsequent processing operations, or be used as-infiltrated.

Generally, the preform can be simply made from inexpensive tapped or packed MgB$_2$ powders, or from MgB$_2$ fibers (continuous or discontinuous). If the superconducting composite is to carry currents, the preform should be continuous (percolating) at least in the direction of the current. The preform can be partially sintered to enhance conductivity and strength. If the superconducting composite is to be used in non-current carrying applications, then a discontinuous superconducting phase is acceptable. With respect to the later, macroscopically, the composite is not superconducting, but it contains a superconducting phase with that property at the microscopic Level. Such materials include superconducting composites to be used for sputtering targets (where excess Mg in the target results in MgB$_2$ composition after deposition due to preferential Mg losses) or as levitators (e.g. for trains).

EXAMPLES OF THE INVENTION

The following non-limiting examples and data illustrate various aspects and features relating to the materials/composites and/or methods of the present invention, including the fabrication of a magnesium diboride superconducting composite having various metallic matrices, as are available through the synthetic methodologies described herein or straight-forward modifications thereof. In comparison with the prior art, the present methods and materials/composites provide results and data which are surprising, unexpected and contrary thereto. While the utility of this invention is illustrated through use of several materials and/or composites and their respective methods of fabrication, it will be understood by those skilled in the art that comparable results are obtainable with various other materials/composites and related methods, such as are commensurate with the scope of this invention.

With reference to examples 1–12, three pure metals, representative of the corresponding aspects of this invention, were chosen as matrices according to their physical and mechanical properties (aluminum), their low melting point and their alloying possibilities with copper (zinc) or finally for their chemical inertness towards magnesium diboride (magnesium). Several metal physical and mechanical properties are summarized in Table 1.

Unless otherwise specified, MgB$_2$ powder was purchased from Alfa Aesar (Ward Hill, Mass., USA), and used as purchased. The aluminum was purchased from C-Koe Aluminum Inc (Eussel, Tex., USA). It was in the form of pellets of 10×8×4 mm with a purity of 99.99%, according to the manufacturer. Since the oxide layer surrounding the pellets can cause some problems of infiltration quality, several pellets were melted together and cast as small ingots of about 25 grams. The magnesium was in the form of rods with a diameter of 14 mm with a purity of 99.99%. The zinc was purchased from Alfa Aesar, in the form of rods with a diameter of 12.7 mm with a purity of 99.9+%, according to the manufacturer. For the infiltration the rods were cut in cylinder of about 35 mm height and 33 grams.

TABLE 1

| Matrix | Melting temperature [° C.] [30] | Density at 25° C. [g/cm$^3$] [30] | Electrical conductivity [% IACS] [31] | Thermal conductivity at 27° C. [W/cm K] [30] | Young's modulus [GPa] [31] | Yield strength [MPa] [31] |
|---|---|---|---|---|---|---|
| Aluminum | 660.3 | 2.70 | 65–66 | 2.37 | 70 | ~10 |
| Magnesium | 650.0 | 1.74 | 38.6 | 1.56 | 45 | 21 |
| Zinc | 419.5 | 7.14 | 28.3 | 1.16 | 96.5 | 46 |

Example 1

Representative Preform Preparation. First, the powder was sieved in air with a 200 mesh sieve, which corresponds to a size of 75 μm. Thus two powders were obtained, one with a particle size greater than to 75 μm and one with a particle size less than to 75 μm. The larger +200 mesh size was used for infiltration since it is easier to infiltrate large particles.

A quantity of 8–10 grams of MgB$_2$ powder was put into a crucible. Infiltrations with magnesium were made in steel crucibles, while infiltrations with aluminum and zinc were made in alumina crucibles, because magnesium may react with alumina and aluminum and zinc react with steel. Alumina crucibles were about 40 mm high with an inside diameter of about 25 mm and steel crucibles were 60 mm high with an inside diameter of about 14 mm.

The MgB$_2$ powder was uniaxially pressed to achieve a higher density,. The maximum pressure applied with alumina crucibles was 15 MPa. This limitation was due to the low tensile strength of alumina and led to powder preform densities of about 53–58% as measured from the mass and the dimensions of the preforms. With steel crucibles, much higher pressure can be applied but equivalent pressures were applied to have similar densities except for composite C-M2. The pressure was applied after each addition of 2 g of powder in order to have a homogeneous powder density. Finally the metal was placed above the powder. A thin layer of about 2 mm of alumina powder (99,9+% pure, purchased from Alfa Aesar) was applied between the MgB$_2$ powder and the aluminum or zinc, to prevent any reaction during heating.

Example 2

Representative Infiltration Process. A schematic description of the infiltration system can be seen in FIG. 1. First the sample was placed in a steel basket. This basket and the thermocouples were fixed to the cover, which was taken down and pressed with a screw in order to close the furnace and make it air-tight. Before heating the furnace atmosphere was flushed by successively pumping a vacuum and injecting argon to 1 atm. This operation was repeated two or three times to remove all gas from the furnace, especially oxygen. Then a vacuum was created, with a maximum pressure of 35 Torr, and the furnace heated to 730° C. for Al/MgB$_2$, 800° C. for Mg/MgB$_2$ and 550° C. for Zn/MgB$_2$ in 70 minutes. When the process temperature was reached, it was maintained constant for 30 minutes for Al/MgB$_2$ and Mg/MgB$_2$ composites and for 75 minutes for Zn/MgB$_2$ composites to allow the metal to fully melt and form a seal above the preform. This time was longer with the latter composites because of the smaller thermal gradients inside the furnace due to a lower infiltration temperature. After that, the heating was stopped and the argon rapidly introduced in the furnace. The pressure applied on the metal increased to 3.2 MPa in 120 seconds. Finally the sample was cooled down to 200° C. in 25 to 40 minutes.

The temperature in the furnace was measured with four K-type thermocouples, which were at different heights in the furnace. The first was placed at 19.7 cm from the top of the furnace, the second at 28.2 cm, the third at 37.5 cm and the fourth at 31.4 cm. This latter thermocouple, which was in the basket, was the most important because it gave values closest to the crucible temperature.

Example 3

From the foregoing, five composites, C, were produced and tested. They differed by their matrix (A, M or Z) and their volume fraction of MgB$_2$, so both effects were studied. Their designation and composition can be found in Table 2, which also gives the theoretical density of each composite. To calculate the theoretical density $\rho_{th}$, equation (1) was used:

$$\rho_{th} = f_{MgB_2} \cdot \rho_{MgB_2} + f_M \cdot \rho_M \quad (1)$$

where $f_{MgB2}$ is the volume fraction of MgB$_2$, $\rho_{MgB2}$ the MgB$_2$ density, $f_M$ the volume fraction of the matrix and $\rho_M$ the density of the matrix. The MgB$_2$ density, was taken as being 2.61±0.01 g/cm$^3$, this value resulting of several measurements of the +200 mesh MgB$_2$ powder in helium. The pycnometer was first calibrated in measuring the density of MgO powders, which densities were exactly known. The difference with the theoretic density (2.66 g/cm$^3$) can be due to a difference in the stoichiometry of the powders or to a not fully dense powder.

The errors of 2 or 5% for the preform densities were due to the fact that these densities were measured geometrically and not with more rigorous methods. The preform density of composite C-M2 has a greater incertitude because of a deformation of the bottom of the crucible during the uniaxial pressing, which made the geometric estimation more difficult.

TABLE 2

| Designation | Matrix | MgB$_2$ volume fraction [%] | Theoretical density [g/cm$^3$] |
|---|---|---|---|
| C-A1 | Aluminum | 47.5 ± 2.0* | 2.656 ± 0.004 |
| C-A2 | Aluminum | 57.5 ± 2.0 | 2.647 ± 0.005 |
| C-M1 | Magnesium | 53.6 ± 2.0 | 2.206 ± 0.023 |
| C-M2 | Magnesium | 70.0 ± 5.0 | 2.348 ± 0.052 |
| C-Z1 | Zinc | 58.1 ± 2.0 | 4.507 ± 0.096 |

*estimated error

Six preforms were also prepared to test different variants of heat treatments based on the sintering found in the literature. They are summarized in Table 3. Two parameters were studied in particular: the temperature and the atmosphere. For this last parameter, the vacuum was in the range of 10$^{-7}$ Torr in a continuously pumped furnace. For the last treatment, under magnesium vapor, the preform was put in a steel crucible and topped with a piece of pure magnesium. The crucible was encapsulated in a glass tube, thus, at high temperature, a saturated atmosphere in magnesium was created. For the heat treatments at 950° C., the time was also changed. treatment Particles

TABLE 3

| Heat treatment | | | Particles |
|---|---|---|---|
| Temperature [° C.] | Time [h] | Atmosphere | size [μm] |
| 750 | 8 | vacuum | <75 |
| 800 | 8 | vacuum | <75 |
| 850 | 8 | vacuum | <75 |
| 950 | 2 | vacuum | <75 |
| 950 | 2 | vacuum | >75 |
| 950 | 4 | Mg vapor | >75 |

Example 4

The total, closed and open porosities were determined with two different methods. First a small sample of composite was cut with a diamond saw and weighted in the air. This mass was called dry mass, m$_d$. Then the closed porosity was determined with a pycnometer AccuPyc 1330 (Micromeritics, Norcross, Ga., USA). Helium was introduced in an evacuated chamber where the sample was placed until every free space was filled. Helium was used because of its high diffusivity, which can thus enter every pores even the very small ones. As the chamber and infiltrated gas volumes were known, the volume of the sample could be determined. Thus, with the dry mass of the sample, the pycnometer calculated the pycnometer density, $\rho_{pyc}$, of the sample. The machine made this step ten times and the average pycnometer density was calculated. Finally the closed porosity P$_c$ was calculated from:

$$P_c = \left(\frac{\rho_{th} - \rho_{pyc}}{\rho_{th}}\right) \cdot 100 \quad (2)$$

The total porosity was determined using the Archimede's principle. First, as MgB$_2$ reacts with water, the sample was greased and weighted in air. This gave the greased mass, m$_g$. Then the sample was put on a hanger and weighted in water giving the hanger+sample mass, m$_{h+s}$. Then only the hanger was weighted in water giving the hanger mass, m$_h$. This step was made five times to have an average total porosity. The bulk volume $V_b$ and the bulk density $\rho_b$ were calculated solving equations (3) and (4), respectively. Finally, the total porosity $P_t$ could be calculated solving equation (5).

$$V_b = \frac{m_g + m_h - (m_{h+s})}{\rho_{H_2O}} \quad (3)$$

where $\rho_{H2O}$ is the water density.

$$\rho_b = \frac{m_d}{V_b} \quad (4)$$

$$P_t = \left(\frac{\rho_{th} - \rho_b}{\rho_{th}}\right) \cdot 100 \quad (5)$$

The open porosity $P_o$ was calculated as being the difference between the total and closed porosities.

$$P_o = P_t - P_c \quad (6)$$

First the composites were cut and ground with mortar and pestle. Then, a thin layer of powder was placed on a glass strip. Because this strip was placed in a vertical position in the diffractometer, some methanol was added to the powder and the whole was lightly pressed to prevent the powder from falling down. Finally X-Ray diffraction was performed with a Rigaku D/MAX-IA diffractometer using a Cu—Kα radiation (λ=0.154 nm) over a 2θ range from 10° to 80° at a step width of 0.05° for the collection of diffraction patterns. Data acquisition was carried out with Datascan (Materials Data Inc.) and patterns were analyzed with Jade 5 (Materials Data Inc.) and PCPDFWIN 2.22 (ICDD).

Example 5

The samples used for the magnetic tests were small parallelepipeds of about 3×1×1 mm cut with a diamond saw. The measurements were performed using a Quantum Design MPMS5 magnetometer with a 6-cm specimen travel. A $2^{nd}$ Order Discriminator method (inductive method) was used, which consisted of measuring the magnetic moment of the samples by moving them through four superconducting detection coils in a series of discrete steps. At each step, the magnetic moment of the samples produced a magnetic flux through the detection coils, which was then detected by a SQUID. A feedback circuit counteracted the flux contribution from the samples by introducing an opposing magnetic field to the superconducting circuit. This feedback current could be calculated as it passed through a known resistor where the voltage was measured. For the calculation of the critical current density, the magnetic moment was measured at 4.5 K in an applied field between −20000 and 20000 Oe after cooling in a field of −20 Oe. The values of the magnetic moment at zero field were then used to solve equation (7). For the determination of Tc, the magnetic moment was measured between 20 K and 45 K at zero field after cooling in a field of −20 Oe.

$$J_c = \frac{24m_c}{hlw^2} \quad (7)$$

where $J_c$ was the critical current density [A/m²], $m_c$ the magnetic moment at zero field [emu], h the heights of the samples [m], l their length [m] and w their width [m]. More details about this equation can be found in Appendix C.

The curves of magnetic moment versus the applied field measurements took into account both macroscopic and microscopic current contributions. However, the effect of the macroscopic current, which is the current that goes through the composite, is predominant.

Example 6

Samples were cut with a diamond saw to a parallelepiped shape and a size of about 6-6.6×3×3 mm. The mechanical characterization was made through an uniaxial compression test with a Sintech 20/G machine. Samples were placed in a cage in a vertical position and compressed at a rate of 0.006 mm/s, which is equivalent to a strain rate of about $10^{-3}$ s$^{-1}$. Such a low speed was used in order to be in quasi-static conditions. The pressure was applied on the samples via a mobile steel cylinder, which slid inside the cage by an opening at the top of the cage ensuring an uniaxial pressure on the samples. As the load and the displacement were measured, equations (8) and (9) were solved to find the engineering stress and strain. The displacement was measured following the displacement of the mobile traverse.

$$\sigma_{max} = \frac{F_{max}}{S} \quad (8)$$

where $\sigma_{max}$ is the ultimate compressive stress [MPa], $F_{max}$ the maximum load [N] and S the cross-section of the sample [mm²].

$$\varepsilon_{max} = \frac{d}{h} \quad (9)$$

where $\varepsilon_{max}$ is the strain at $\sigma_{max}$ [−], d the displacement [mm] and h the initial height of the sample [mm]. The deformation of the system was determined, by running a compression with only the cage but no sample, and then subtracted.

Example 7

Metallographically, in order to observe the composites microstructures, samples were first cut with a low speed diamond saw. Then they were mounted for optical microscopy in acrylic and polished with increasingly fine silicon carbide paper Carbimet™ (Buehler). The final grit was 2400. Then the samples were observed with a Nikon optical microscope. All pictures have been taken using a camera RT Spot (Dynamic Instruments, Inc) connected to the microscope.

The fracture surfaces of the composites after the compression test were observed using a Hitachi S-4500FE scanning electron microscope in backscattering electron detection mode with an accelerate voltage of 15 kV.

Example 8

Figure 2:
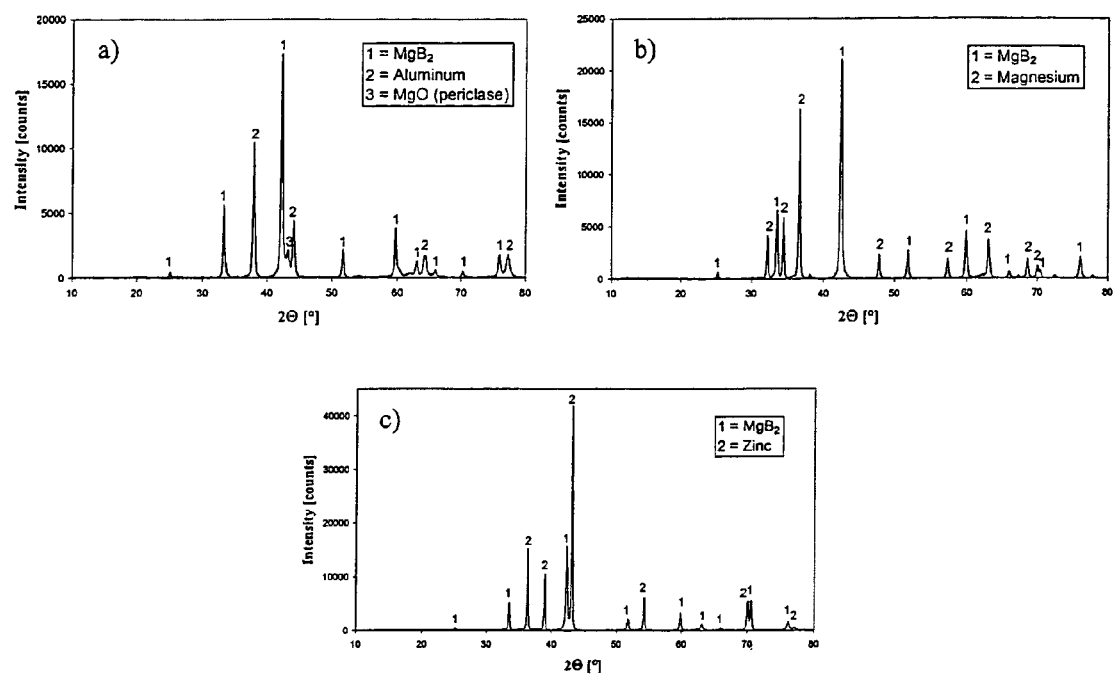
FIG. 2: X-ray diffraction patterns of the composites C-A2 (a), C-M1 (b) and C-Z1 (c). None of these patterns shows any reaction during infiltration. A small peak of MgO, however appeared for the composite C-A2.
Figure 3:
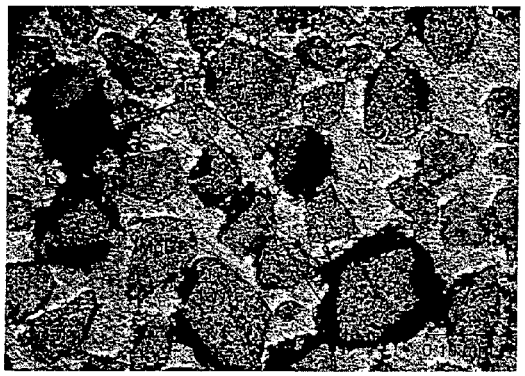
FIG. 3: Micrograph showing microstructure of composite C-A1.
Figure 6:
FIG. 6: Micrograph showing microstructure of composite C-M1.
Figure 4:
FIG. 4: Micrograph showing microstructure of composite C-A1.

No decomposition of $MgB_2$ particles or reaction with the matrices was observed during the infiltrations, as seen on the different X-Ray patterns in FIG. 2. The only visible peaks corresponded to the $MgB_2$, Al, Mg and Zn phases, but for a small peak of MgO with composite C-A2.

Example 9

Figure 7:
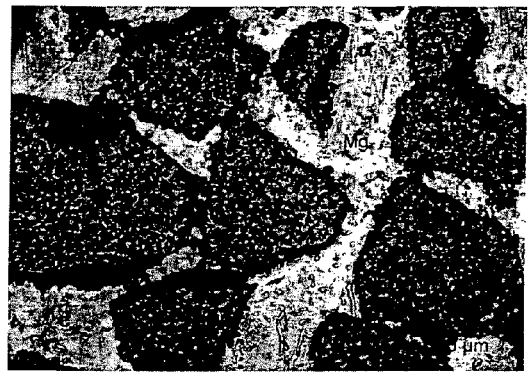
FIG. 7: Micrograph showing microstructure of composite C-M1.
Figure 5:
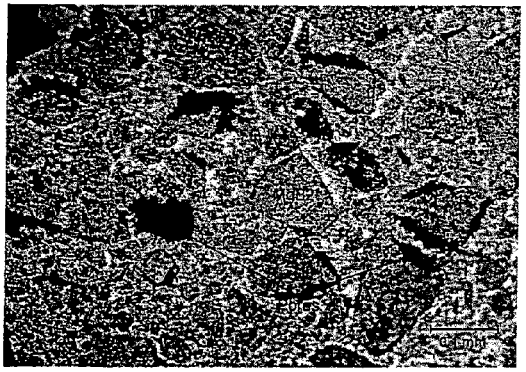
FIG. 5: Micrograph showing microstructure of composite C-A2.
Figure 8:
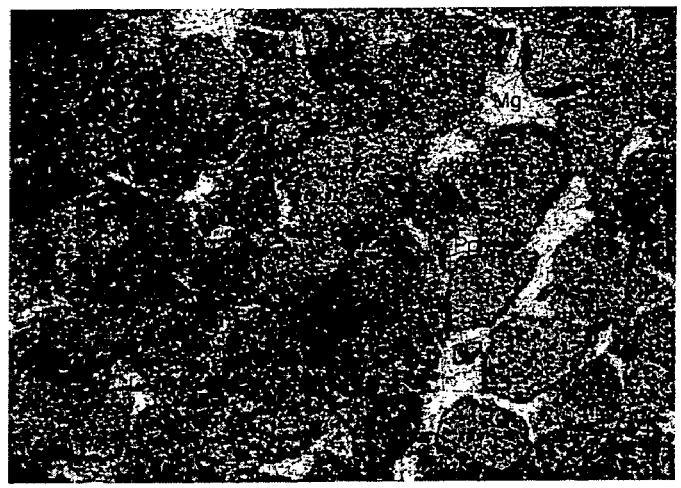
FIG. 8: Micrograph showing microstructure of composite C-M2.

The microstructures of the five composites (FIGS. 3 to 7) reveal macroscopically homogeneous distributions of MgB$_2$ particles, except at the composite-crucible interface (not-shown here), but with a poor connectivity between each others even with a volume fraction of particles of about 70% (FIG. 8). The high ductility of the matrices and the brittleness of the particles, made the matrices fairly dirty. Indeed, during polishing, small fragments of particles were embedded in the matrix, which were very difficult to remove afterward, especially for composite C-M2. Nevertheless, in accordance with the X-Ray analyses, no other phases than the starting ones can be seen, notably around the particles, which would have been the most probable area to find reaction products. This can be clearly seen in FIGS. 8, 11, 13 and 14, which have the highest magnification. The small dark layer surrounding the particles is the shadow of these latter due to a non-flat surface of the samples; the particles being higher than the matrix.

Example 10

X-Ray diffractions were performed on the composites to identify their different phases and to determine if chemical reactions occurred during infiltration. The powder method was used.

Figure 9:
FIG. 9: Micrograph showing microstructure of composite C-Z1.
Figure 10:
FIG. 10: Micrograph showing microstructure of composite C-Z1.

However, under the techniques used, the microstructures of the composites reveals some porosity. Pore sizes vary from 50 µm to several tenths of millimeters, which is much larger than the size of the particles. Different kinds of pores can be seen in the composites. The microstructures of composites C-A1 (FIGS. 3 and 4) and C-A2 (FIG. 9) reveal some pores located along the particles-matrix interfaces, as it may be due to missing particles or parts thereof. Other pores totally surround the particle or are located in the matrix, whether or not due to a missing particle. The microstructures of composite C-Z1 (FIGS. 9 and 10) reveal two kinds of pores, located either at the particles-matrix interfaces or in the matrix. In this last case, the pore seems to be due to a missing particle. The microstructures of composites C-M1 (FIGS. 6, 7) and C-M2 (FIG. 8) reveal fewer pores than composites with aluminum or zinc matrices. For composite C-M1, the pores seem due to missing parts of particles. The pore shown on microstructure of composite C-M2 seems to be due to a missing particle.

The microstructure observations are confirmed by the porosity measurements carried out on the five composites. The results of these measurements are summarized in Table 4. It appears that composites with aluminum and zinc matrices have a greater amount of porosity—17.1–20.4% and 36.4% respectively—while composites with magnesium matrices have a much lower, but not insignificant, quantity of porosity between 5.6% and 7.7%. For all composites, except C-A2, the closed porosity is greater than the open porosity.

TABLE 4

Total, closed and open porosity of the Metal/MgB$_2$ composites

| Composite designation | Preform density [%] | Composite theoretical density [g/cm$^3$] | Total porosity [%] | Closed porosity [%] | Open porosity [%] |
|---|---|---|---|---|---|
| C-A1 | 47.5 ± 2.0 | 2.656 ± 0.004 | 17.1 ± 0.1 | 9.8 ± 0.7 | 7.3 ± 0.8 |
| C-A2 | 57.5 ± 2.0 | 2.647 ± 0.005 | 20.4 ± 0.2 | 8.8 ± 0.6 | 11.6 ± 0.5 |
| C-M1 | 53.6 ± 2.0 | 2.206 ± 0.023 | 5.6 ± 1.0 | 4.9 ± 1.8 | 0.6 ± 0.7 |
| C-M2 | 70.0 ± 5.0 | 2.348 ± 0.052 | 7.7 ± 2.0 | 5.9 ± 2.4 | 1.8 ± 0.5 |
| C-Z1 | 58.1 ± 2.0 | 4.507 ± 0.096 | 36.4 ± 1.3 | 27.7 ± 1.6 | 8.7 ± 0.4 |

Porosity is not preferred because of less than optimal mechanical, electrical, magnetic and thermal properties. Based on these examples, its origin is still unclear but may be attributable to a combination of several factors. The cutting of the samples is certainly responsible for a part of the open porosity which does not really exist in the composites. Indeed, as the micrographs show, it seems that some pores are due to missing particles or parts of them. Polishing may have pulled out some parts of particles. Neither process nor its result is necessarily indicative of the composite. Indeed, no open porosity exists in a Mg/MgB$_2$ composite of another example, below. Another issue comes from the uncontrolled solidification, which always leads to some porosity. If it is improbable that the melt solidified before infiltrating completely the whole preform, as more than 3 minutes passed before the temperature was below the melting point of the matrices, some solidification shrinkage probably occurred and led to the formation of open porosity. With volume contractions of, respectively, about 6.5% and 3.2% for aluminum and zinc, composite C-A2 showed 11.6% of open porosity while composite C-Z1 only 8.7%, this for a similar volume fraction of particles. FIG. 7 shows a pore of several tenths of millimeter, which can be resulting of some volume contraction during solidification. Even if pure magnesium has a volume contraction of 4.2%, composite C-M1 and C-M2 have nearly no open porosity, which is maybe due to stronger bonds between particles and the matrix.

Example 11

Figure 11:
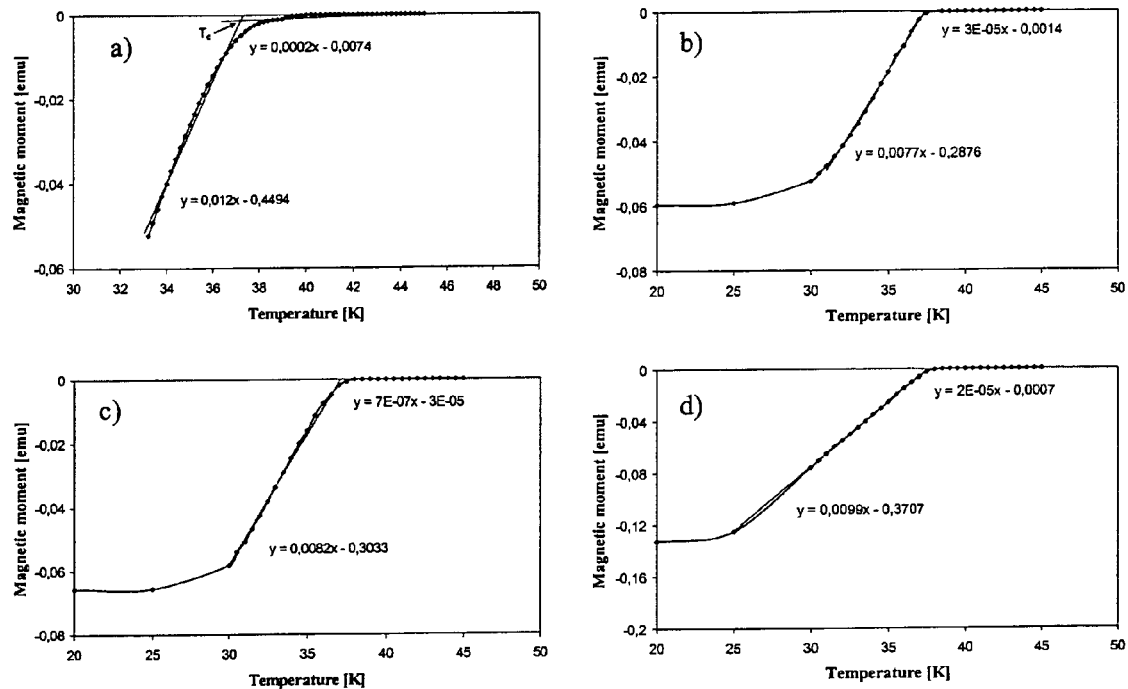
FIG. 11: Magnetic moment transitions for the composites. a) C-A2; b) C-M1; c) C-M2 and d) C-Z1. All show a critical temperature between 37–37.4 K. The composite CZ-1 shows a particular broad superconducting transition.
Figure 12:
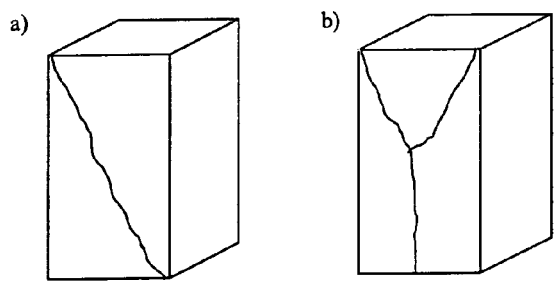
FIG. 12: Schematic illustrations of the fracture facies of the composites a) C-A2 and C-Z1 showing a near 45° angle crack; (b) C-M1 and C-M2 showing multiple cracks. These two facies are typical of shearing.
Figure 13:
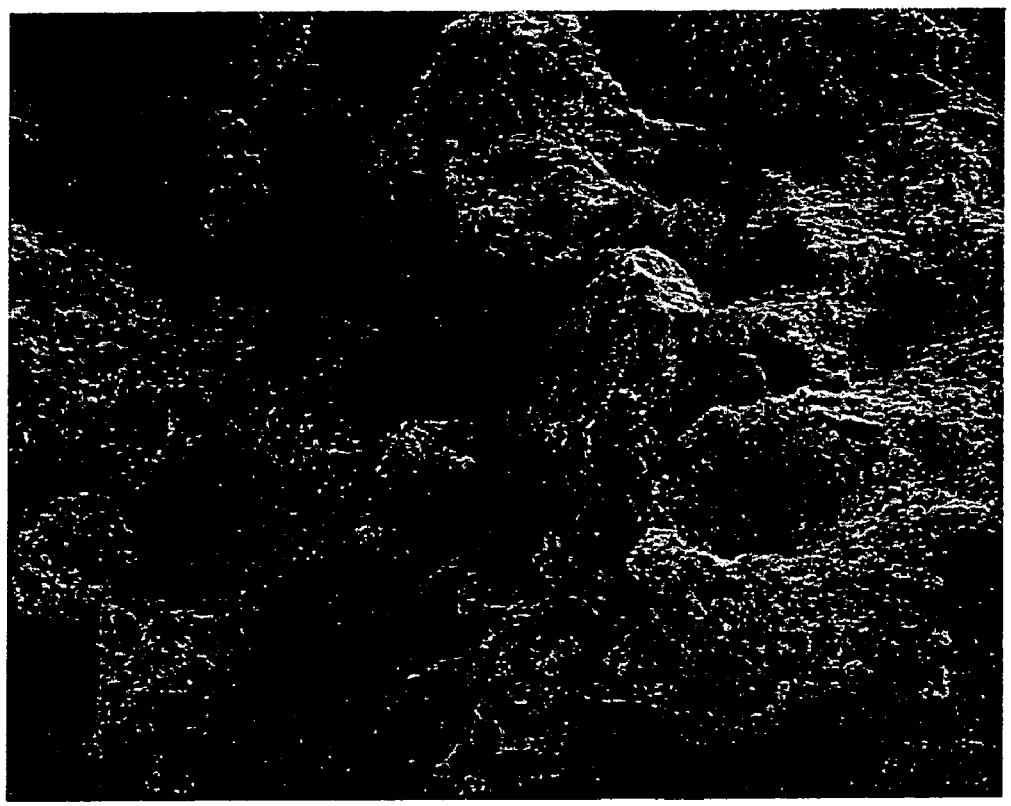
FIG. 13: Fracture facies of composite C-Z1 after the compression test. Particles appear unbroken. The fracture seems to occur at the particles-matrices interfaces. Numerous pores are also visible near the particles.

FIG. 11 plots the temperature dependence of the magnetic moment of composites C-A2, C-M1, C-M2 and C-Z1, which exhibits, for each one, an onset of the magnetic transition between 37.0 and 37.4 K. The composite of example 13 was found to have a T$_c$ of 38 K, almost 1 K higher, but also had less porosity.

The transition widths (measured as the difference between the temperature at 10% and 90% of the final value of the magnetic moment) are summarized with the values of T$_c$ and J$_c$ in Table 5. It appears that they are much larger than for pure magnesium diboride, usually reported as being lower that 1K at low field. Composites C-M1 and C-M2 have close transition widths, 6.5 and 6.2 K, respectively, when the one of C-Z1 is 9.1 K. The much higher porosity in this last composite is responsible of this difference. The higher volume fraction of superconducting particles in C-M2 may explain the difference of 0.3 K between the two transition widths of the Mg/MgB2 composites, even if this difference is not statistically significant. Concerning composite C-A2, the measurement was not made on a sufficient large range of temperatures to allow the calculation of $\Delta T_c$, but a lower bound is 4.2 K.

TABLE 5

Magnetic properties of the Metal/MgB$_2$ composites

| Composite designation | $T_c$ [K] | $\Delta T_c$ [K] | $J_c$ [A/cm$^2$] |
|---|---|---|---|
| C-A2 | 37.4 ± 0.2 | >4.2 K | $2.61 \cdot 10^5 \pm 2.6 \cdot 10^4$ |
| C-M1 | 37.3 ± 0.2 | 6.5 ± 0.2 | $4.22 \cdot 10^5 \pm 4.2 \cdot 10^4$ |
| C-M2 | 37.0 ± 0.2 | 6.2 ± 0.2 | $5.60 \cdot 10^5 \pm 5.6 \cdot 10^4$ |
| C-Z1 | 37.2 ± 0.2 | 9.1 ± 0.2 | $3.62 \cdot 10^5 \pm 3.6 \cdot 10^4$ |

The critical current densities are quite similar for the four composites, in the range of $10^5$ A/cm$^2$, which is one order of magnitude lower than for pure full dense MgB$_2$ bulks. C-M1 and C-M2, because of less porosity, show higher $J_c$'s than the two other composites. As expected, the highest fraction of superconducting particles leads to the highest critical current density (C-M2) because of a stronger proximity effect. On the other hand, it is surprising to have a higher $J_c$ for C-Z1 compared to C-A2 despite a greater porosity. The proximity effect is due to some Copper's pairs that can pass from particles to particles by going through the matrix, the matrix becoming superconducting too. Larger spaces between particles, porosity and insulator matrices reduce this effect. These high values of $J_c$'s also seem to indicate that no or only little degradation of the magnetic properties of the particles occurred during the infiltrations. Compared to the critical current density of 66 A/cm$^2$ measured for the composite of example 13, the values measured in this thesis are four orders of magnitude higher. Even if composites C-M1 and C-M2 have a much higher volume fraction of particles compared to Dunand's composite, which volume fraction of MgB$_2$ was 38%, such a difference is surprising.

Example 12

Figure 14:
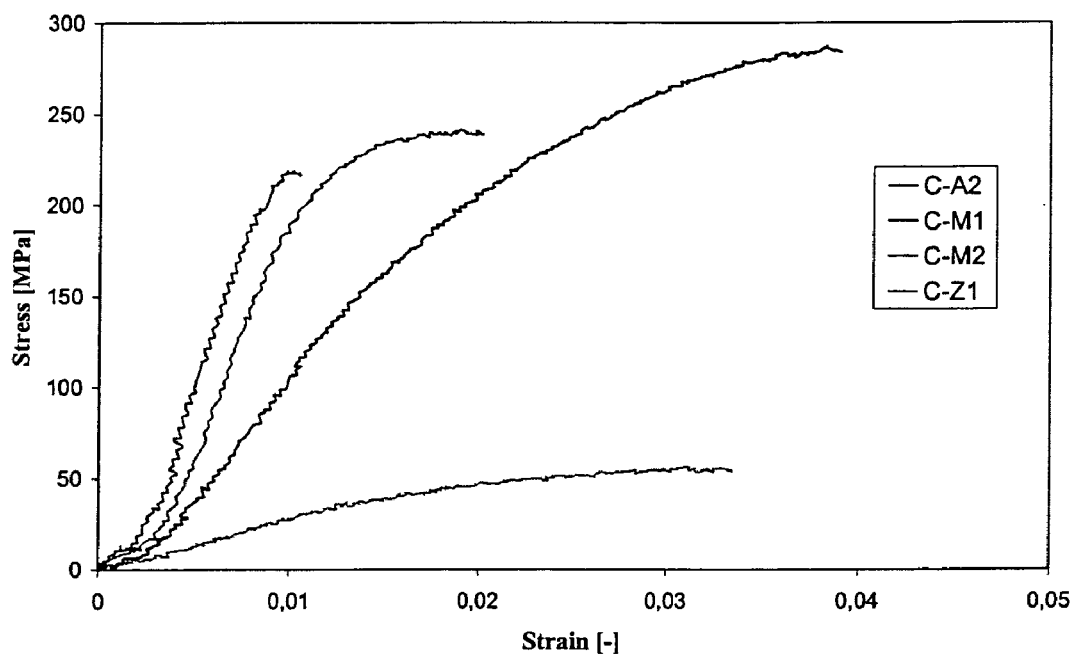
FIG. 14: Compressive curves stress-strain for the composites C-A2, C-M1, C-M2 and C-Z1. C-A2 has the highest compressive strength and is the most ductile despite a porosity of 20%. C-Z1 has a very poor compressive strength due to its important porosity. C-M2 is less ductile but has a higher elastic modulus compared to C-M1 because of its higher volume fraction of particles.
Figure 16:
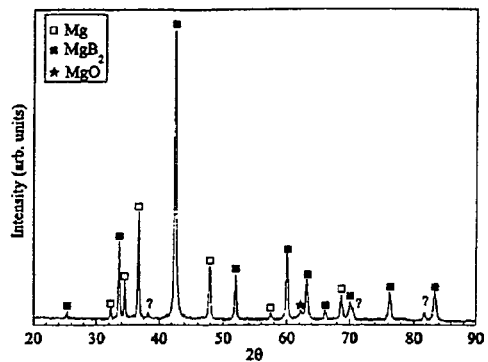
FIG. 16: XRD spectrum of Mg/MgB$_2$ composites fabricated by pressure infiltration of MgB$_2$ powders with liquid Mg.
Figure 17:
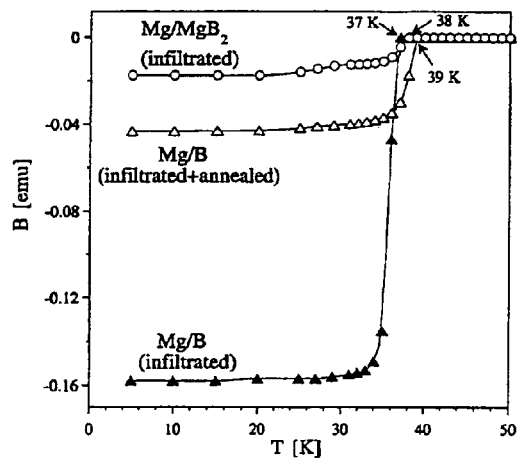
FIG. 17: Temperature dependence of magnetization of MG/MGB$_2$ composites fabricated by pressure infiltration of MGB$_2$ powders with liquid Mg (Mg/MGB$_2$), and by reactive pressure infiltration of B powders with liquid Mg/MGB$_2$ before and after annealing.

FIG. 14 shows the compressive stress-strain curves for the composites C-A2, C-M1, C-M2 and C-Z1. Several values are summarized in Table 6. As the samples fractured at the ultimate compressive stress, data beyond this point is not shown here. Schematic illustrations of the fracture surfaces are shown in FIG. 16. C-A2 and C-Z1 cracked according to a near 45° angle when C-M1 and C-M2 show multiple cracks. Both facies are typical of shearing. FIG. 17 shows the rupture surface of composite C-Z1. It appears that it cracked at the particles-matrix interfaces, denoting poor bond strengths between phases, which was worsen by the large pores. The surfaces are similar for the Al/MgB$_2$ composites.

As expected, the microstructure has a big influence on the mechanical properties. C-A2 and C-Z1 show an important plasticity of 4 and 3.1% respectively, which are much higher than the two Mg/MgB$_2$ composites (less than 2%). For the most part, these values are probably due to densification of the composites due to their high porosity. However, even without porosity it is probable that C-A2 would have a higher ductility than the other composites because of the high ductility of aluminum compared to magnesium and zinc. The results of the ultimate compressive stresses are more interesting. Al/MgB$_2$ and Mg/MgB$_2$ composites have ultimate compressive stresses above 200 MPa, which probably represent an appreciable gain in comparison with the brittle pure magnesium diboride, not yet reported in the literature. Moreover, even with a high porosity of 20%, composite C-A2 has a higher strength than C-M1 and C-M2. The high ultimate compressive stress of C-A2 is however offset by its low modulus due again to its porosity. It is only equivalent to the half of the one of the Mg/MgB$_2$ composites. The strength and the modulus of C-Z1 are really low, due to its high porosity. It is probable that, in this case, the porosity was so high that, in addition to be a mechanical weakness, it prevented strong bonding between the matrix and the particles. For C-A2 and C-Z 1, measured moduli must be considered with caution.

The influence of the volume fraction of particles on the mechanical properties can be seen with composites C-M1 and C-M2. As expected, because of the usual high modulus and low ductility of ceramics, it appears that composite C-M2, which has the highest volume fraction of particles, has the highest modulus, 30 GPa, and the lowest ductility, 1%. For composite C-M1 these values were, respectively, 26 GPa and 1.9%. Nevertheless, the moduli cannot be compared with the Young's moduli of the matrices and pure MgB$_2$, as the strain was measured by crosshead displacement and not by sample extensometry, which only gives a large approximation of the "true" Young's modulus. Concerning the ductility of the Mg/MgB$_2$ composites, 1% is a sensible gain compared to pure MgB$_2$, whose ductility is expected to be much lower. Finally, the difference of ultimate compressive stress between the two composites is only 23 MPa, which is probably not significant.

TABLE 6

Mechanical properties Metal/MgB$_2$ composites tested in compression.

| Composite Designation | Modulus* [GPa] | Ultimate compressive stress [MPa] | Strain at $\sigma_{max}$ [-] |
|---|---|---|---|
| C-A2 | 14 ± 2 | 287.1 | $4.01 \cdot 10^{-2}$ |
| C-M1 | 26 ± 2 | 241.2 | $1.89 \cdot 10^{-2}$ |
| C-M2 | 30 ± 2 | 218.6 | $1.01 \cdot 10^{-2}$ |
| C-Z1 | 3 ± 2 | 56.4 | $3.12 \cdot 10^{-2}$ |

*This modulus is not the Young's modulus but only an approximation, since the strain has been measured by crosshead displacement and not by samples extensometry.

Example 13

In further demonstration of features illustrated in several previous examples, a crucible was built by closing one end of a mild carbon steel tube (inside diameter: 15.875 mm) with a stainless steel compression fitting. A quantity of 4.414 g of MgB$_2$ powders (as received from Alpha Aesar) was poured directly into the crucible, in contact with the stainless steel fitting and the steel crucible. A quantity of 7.028 g of Mg metal pieces (99.99% purity) was added directly above the powder, with which it was in contact.

The filled crucible was placed in a pressure infiltrator which was evacuated thrice (with intermediate argon flushing) then heated under vacuum to a temperature of 800° C. over about 100 minutes. Temperature was held constant for 35 minutes, ensuring that the metal melted on top of the MgB$_2$ powder preform forming a liquid seal. Pressure was raised to 500 psi in about 1 minute by introduction of argon gas, forcing the melt in the interstices of the evacuated MgB$_2$ preform. Cooling under Ar pressure over 45 minutes reduced the temperature to 195° C. The crucible was then removed and air cooled.

The steel crucible was machined using carbide tooling, and a diamond blade was used to section top and bottom of the ingot, and to cut it in half longitudinally. The composite was found to be very hard (carbide tooling was needed to face the composite ingot) and mechanically strong, indicating a good bonding between ceramic and metal. After machining, the composite consists of a cylinder of 17.04 mm height and 12.75 mm diameter. A large vein of pure Mg was visible without magnification, running the whole length of the billet. It was cut in half with a diamond blade and the density of the half without the vein was found to be 2.074 g/cm$^3$ by the water displacement method. With densities of 1.70 and 2.63 g/cm$^3$ for Mg and MgB$_2$ and assuming no porosity, the calculated volume fraction of MgB$_2$ is 38%. This value is lower than expected, based on packing of monosized powders, and the result of the very broad distribution of powders without sintering. MgB$_2$ percolation is expected, but will not be extensive. Subsequent pressing experiments on preform using a piston to push the preform into the crucible have resulted in volume fraction of MgB$_2$ over 70%.

Example 14

Metallography was performed on the material of the previous example, using SiC paper followed by 1 μm diamond lapping in oil. Metallographic observation at 400× magnification shows a fully infiltrated composite, with no porosity and no reaction between Mg matrix and MgB$_2$ particulates, indicating a successfully processed composite. The MgB$_2$ particulate size varied widely between about 5 and 100 μm. SEM micrographs of the as-received powder confirm that this wide distribution of particle size was inherent to the as-received powders and remained unchanged by the infiltration step.

Example 15

Figure 15:
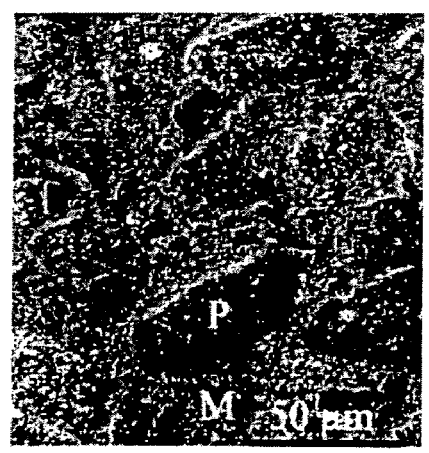
FIG. 15: SEM micrograph of the Mg/MgB$_2$ composite fabricated by pressure infiltration of MgB$_2$ powders with liquid Mg. The Mg matrix (M) is pore free and no reaction is visible at the MgB$_2$ particle (P) interface.

Optical and scanning electron microscope (SEM) observation of metallographic cross sections (polished with SiC paper in water and lapping with 1 μm diamond in oil) shows a fully infiltrated, pore-free composite (FIG. 15). The Mg matrix is found to neither react with, nor dissolve the MgB$_2$ particles. (FIG. 16 is an x-ray diffraction (XRD) spectrum (acquired with a Rigaku D/MAX-IA diffractometer with Cu Ka radiation) showing that, beside the two main Mg and MgB$_2$ phases, the composite also contains small MgO amounts, probably formed by oxidation during processing.) Further minor unidentified peaks cannot be matched to other magnesium boride phases. The small peak at 38° has been identified as the major B peak in a Mg-13 reactivity study, which may indicate that some elemental B is present, possibly from the as-received MgB$_2$ powders.

Example 16

A sample of the previous material was cut with the following dimensions: 1.55 cm×1.28 cm×0.14 cm (density 2.015 g/cm$^3$, or 30 vol. %). Conductivity measurements were performed. Two current leads were press-fitted at the end of the sample. Two voltage leads were attached with silver epoxy, leaving a measuring length of 0.50 mm. This four point probe is standard for such measurements which consist of applying a direct current to the current leads and reading the voltage at the voltage leads. At room temperature, a resistivity of 16 μΩcm was measured, as compared to literature values of 4.5 μΩcm for pure Mg and 16 Ωcm for pure MgB$_2$. Immersing the sample in liquid helium (at 4 K), the resistivity was found to be zero, up to an applied current of 12.0 A, corresponding to a current density of 66 A/cm$^2$ —much lower than reported for sintered MgB$_2$. At that point, boil off of helium confirmed that superconductivity had broken down, as expected when the critical current has been reached. Improvements in critical current are possible by increasing the MgB$_2$ volume fraction and by increasing its interconnectivity (by using narrowly sieved powders and/or pressing or sintering of the preform).

Example 17

The material/composite of the preceding examples was suitably prepared and tested to determine $T_c$. Magnetic susceptibility was measured in a magnetic field of 50 Oe between 4 and 300 K after zero-field cooling, using a Quantum Design MPMS-5 magnetometer with a 6-cm sample travel. FIG. 17 shows the onset of the magnetic transition at 38 K, close to the value of 39 K reported for pure, sintered MgB$_2$. The transition width is, however, much larger than for pure MgB$_2$, as also reported for a sintered MgB$_2$/Al composite. This may be attributed to areas having degraded local superconductivity (pure Mg, which is not superconducting) from the proximity effect and disorder.

Example 18

Optical microscopy of the infiltrated region of the composite of example 13, revealed a gray, continuous, phase (with a few, small pores) and a few isolated metallic regions, consisting of veins (~50 μcm in width and many millimeters in length) or islands (5–50 μm in size). The XRD spectrum FIG. 18(a) shows that these phases are MgB$_2$ and Mg, respectively, and that no other phases such as MgO or MgB$_4$, are present. Because they are amorphous, the original B powders are undetectable by XRD and optical micrographs showed no trace of them. However, SEM observation at higher magnification revealed that the gray majority phase contains micron-size inclusions, presumably B. While magnetic susceptibility measurements (FIG. 17) confirmed that the sample becomes superconducting, at 37 K, macroscopic samples with gauge length of ~6 mm exhibited nonzero resistivity at liquid-He temperature.

Example 19

The above observations are consistent with partial reaction between B and Mg occurring during infiltration to form a discontinuous, superconducting MgB$_2$ phase within a compacted matrix of unreacted, amorphous boron, also containing large-scale inclusions of Mg. Such a structure could result from the compression of the loosely packed B preform by the pressurized melt, as reported for other infiltrated MMCs with deformable preforms. Indeed, only a modest amount of preform compaction (i.e., from 30.8 to 38.4 vol % density) is sufficient to yield a MgB$_2$/B composite after complete reaction. The relatively low onset temperature of 37 K can be explained, as for the previous composite, by areas of B and Mg with no local superconductivity.

Example 20

Figure 18:
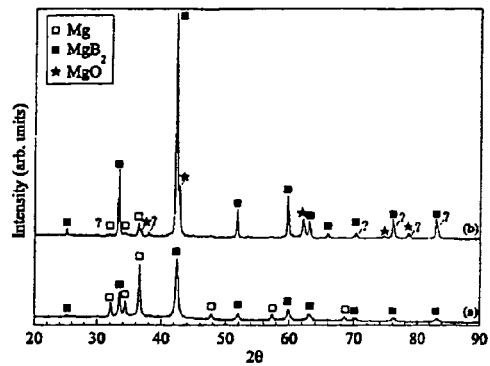
FIG. 18: XRD spectra of composites fabricated by reactive pressure infiltration of B powders with liquid Mg (a) before annealing and (b) after annealing.

A sample of reactively infiltrated composite (example 13) was placed in an inert MgO bed, encapsulated in an evacuated quartz ampoule (together with some pure Mg to establish an atmosphere), and annealed at 950° C. for 30 min. This treatment was expected to lead to chemical equilibrium, based on a reports that Mg and B powders reacted completely to form $MgB_2$ upon holding for 2 h at 950° C. Indeed, FIG. 18 shows that the ratio of the main (100) $MgB_2$ peak to the main (101) Mg peak has increased from 1.2 before annealing to 18.5 after annealing, confirming synthesis of $MgB_2$ from Mg and B, and the almost complete disappearance of Mg. Also, small MgO peaks have appeared and may be due to reaction of Mg with residual $O_2$ or to incorporation of small amounts of MgO powders from the annealing bed. The critical current density could not be measured due to extreme sample brittleness. However, magnetic susceptibility measurements (FIG. 17) demonstrate that the sample becomes superconducting below 39 K, as reported for stoichiometric $MgB_2$ samples.

Example 21

As a variation of the general methodologies described herein, a superconducting phase can be prepared in situ with the associated composite. A quantity of 1.991 g. of amorphous, 99.99% pure boron powders (−325 mesh, supplied by Alpha Aesar) was pressed into a mild steel crucible to a density of 30.8 vol. %. A 2.4 mm layer of MgO (less than 149 μm in size, from Strem Chemical) was added to separate the boron from pieces of magnesium with a mass of 6.824 g. The same infiltration procedure was used, except that the maximum temperature was set at 700° C. and was maintained for 30 minutes. The reaction of this example, infiltration of B by Mg to form $MgB_2$ in situ, was complete in a matter of minutes. Compare, for instance, current fabrication techniques utilizing boron fibers reacted over a matter of hours with magnesium vapor.

The superconducting materials and/or composite structures of this invention can be utilized over a wide range of applications, commensurate with existing superconductors, e.g., current conductive cables (power lines, motors, electromagnets, etc.), or related substrates (electronic devices, etc.), current sensing devices (SQUID, etc.), magnetic repulsion devices (levitators, etc.) and sputtering targets applicable in the preparation of thin films and related composites (molecular beam epitaxy, etc.).

Example 22

For the following examples, demonstrating various methods of this invention and the reactive infiltration of boron powder performs with magnesium metal, 3.729 g of −60 mesh crystalline boron from Alfa Aesar was hand packed in a steel crucible to 50% packing density. On top of the boron, a 3.7 mm layer of MgO powder (Strem Chemical, −100 mesh) was hand packed to prevent reaction between the magnesium melt and the boron before infiltration. A magnesium metal cylinder of 6.591 g was placed upon the MgO in the steel crucible. The sample was heated under vacuum to 800° C. and then pressurized with 3.2 MPa of argon gas. Complete infiltration was observed upon sectioning. A piece of the magnesium infiltrated boron was ground and analyzed using XRD. Other pieces were placed in an MgO bed in a steel crucible and encapsulated into quartz tubes with a piece of pure magnesium to establish an equilibrium vapor pressure and prevent the loss of magnesium in the composite during heat treatments. The quartz tubes were heat treated for 20 min and 2 hrs at 950° C., and 20, 60 and 120 minutes at 700° C. After heat treatments, samples were removed from the tubes and ground with mortar and pestle for XRD analysis of the formation of $MgB_2$ and other phases.

Example 23

Figure 19:
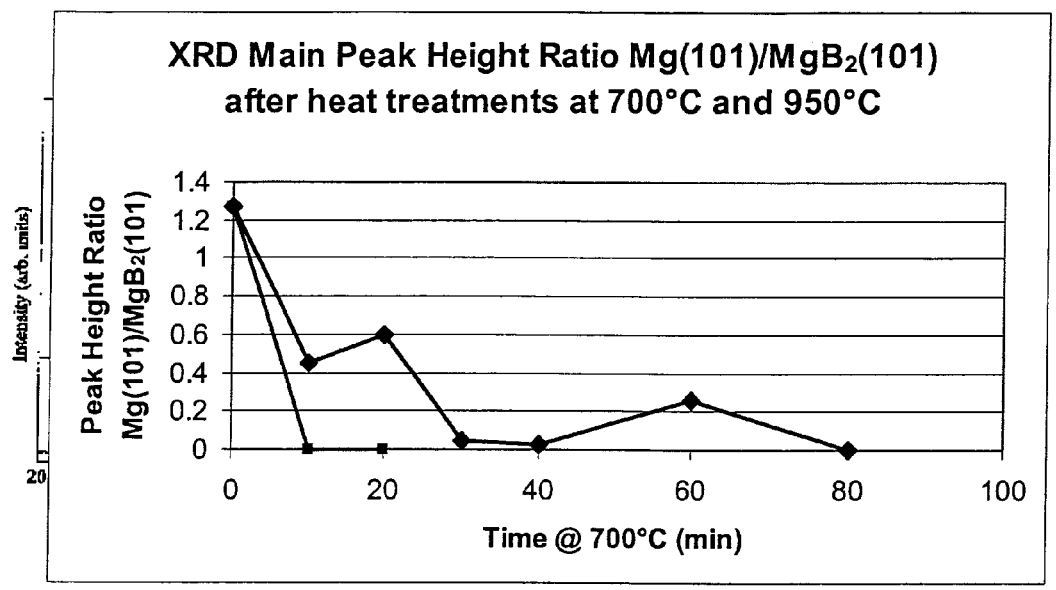
FIG. 19: X-Ray Diffraction analysis peak height ratio of the main magnesium (101) peak to the main MgB$_2$ (101) peak for crystalline and amorphous boron mixture samples initially packed to 38% by volume boron. Blue line shows reaction nearly completed (and magnesium used up) after about 40 minutes at 700° C. Increase in Mg at 60 min suggests some non-uniformity in composition. Red line shows results at 950° C.: reaction is very fast, eliminating the Mg in ten minutes.
Figure 20:
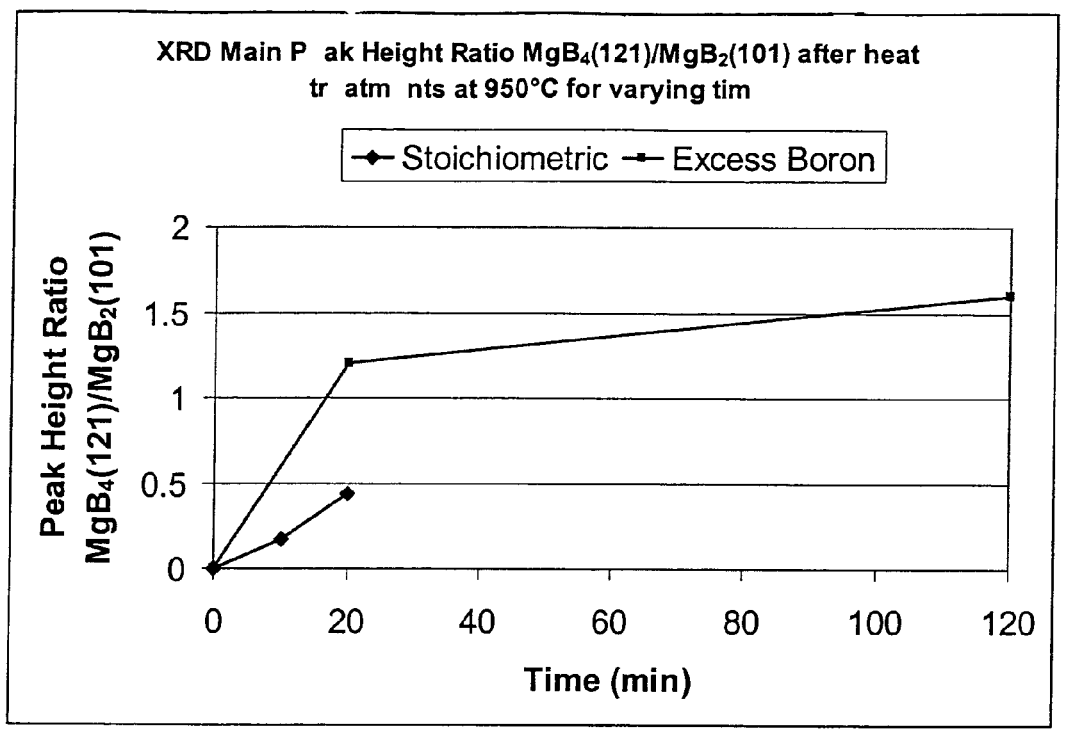
FIG. 20: X-Ray Diffraction analysis peak height ratio of the main MgB$_4$ (121) peak to the main MgB$_2$ (101) peak for stoichiometric (38% packing density) and excess boron (50% packing density) samples heat treated at 950° C.

The 50% packing density of the boron in the previous example was found to result in an excess of boron and formation of some $MgB_4$ during heat treatments. Improved infiltration, below the 39.8% maximum boron packing density for stoichiometric $MgB_2$, was achieved using −325 mesh and −60 mesh boron powers mixed together 1:1 by mass, packed to 38% by volume and infiltrated as discussed above. Complete infiltration was not observed upon sectioning but was estimated to 90% or more. A sample was analyzed with XRD and others heat-treated in quartz tubes, as discussed, for 10, 20, 30, 40, 60 and 80 minutes at 700° C. and 10 and 20 minutes at 950° C. Again, samples were removed after heat-treatment, ground into powder, and analyzed for $MgB_2$ formation using XRD. Results are shown in FIGS. 19–20.

Example 24

Figure 21:
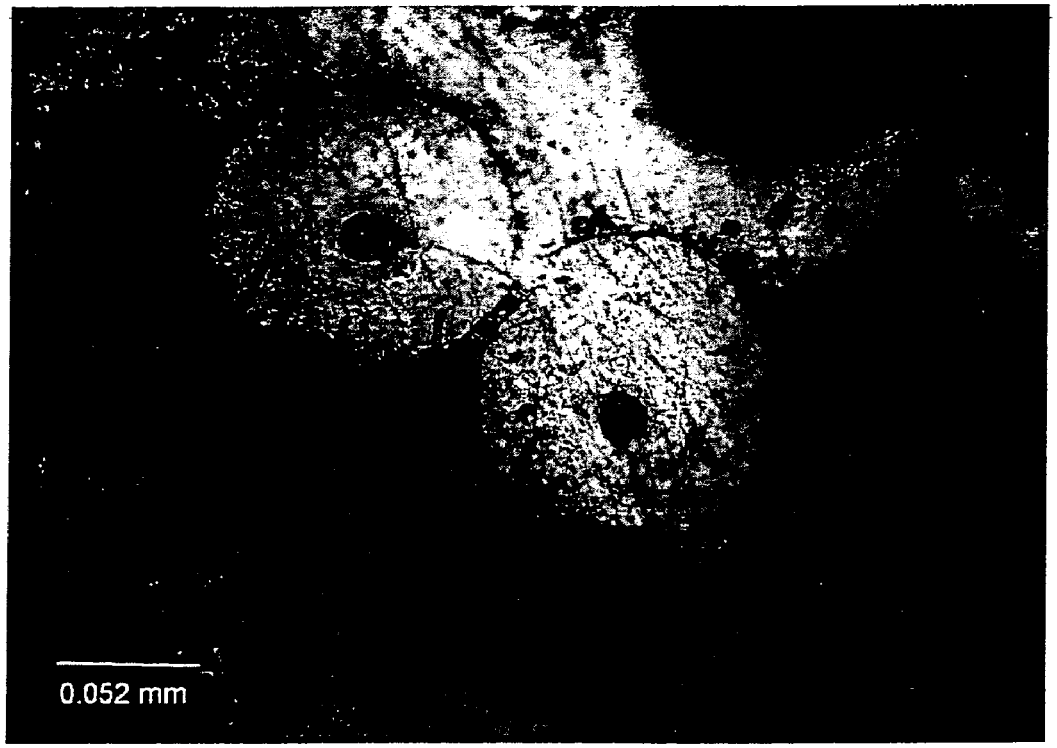
FIG. 21: 400× transverse optical micrograph showing grey reaction product (presumably MgB$_2$) as a result of reaction between boron fibers (two hollow circular shape, now filled with yellow magnesium and with tungsten cores) and the yellow magnesium matrix extending out from the core into the matrix.

Liquid metal infiltration was also investigated to synthesize $MgB_2$ through the infiltration of boron fibers with magnesium metal. To fabricate this composite, 100 micron diameter boron filament (tungsten core, from Textron) was sectioned into approximately 10 mm long filaments with a total mass of 0.1630 g. The filaments were aligned and placed into a 4 mm inside diameter steel crucible. The 4 mm steel crucible was placed inside of a 14 mm inside diameter steel crucible, fixed into place with two other small crucibles, and the smaller crucibles surrounded and covered with MgO powder. A 6.671 g cylinder of magnesium was placed on top of the MgO layer. The same infiltration procedure as discussed above was used. The sample was encapsulated in a quartz tube and heated to 950° C. for 2 hours. A reaction was observed (FIG. 21), with the reaction product most probably being $MgB_2$. However, much of the Mg metal had evaporated and some of the fibers were not reacted.

Figure 22:
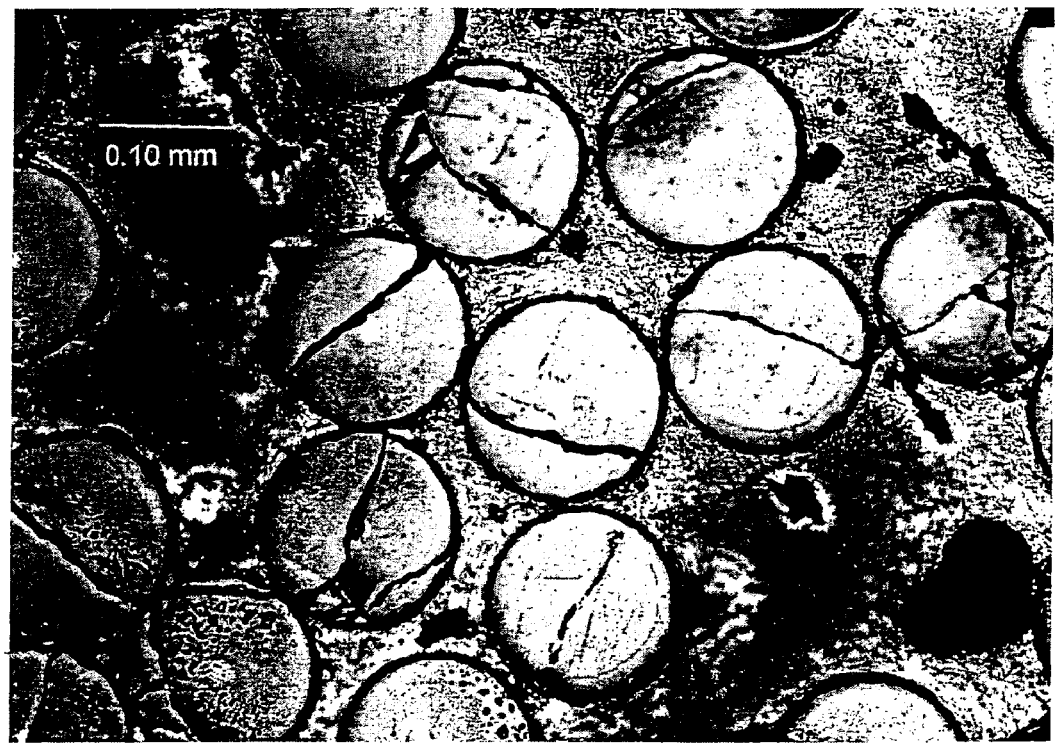
FIG. 22: 200× transverse optical micrograph showing as-infiltrated boron nitride coated boron fiber with a tungsten core. There is no visible reaction between the fibers and the magnesium matrix. The discoloration and "spots" in the matrix are from oxidation and corrosion reactions between magnesium and iron crucible due to water used during polishing. Fiber damage is a preparation artifact.
Figure 23:
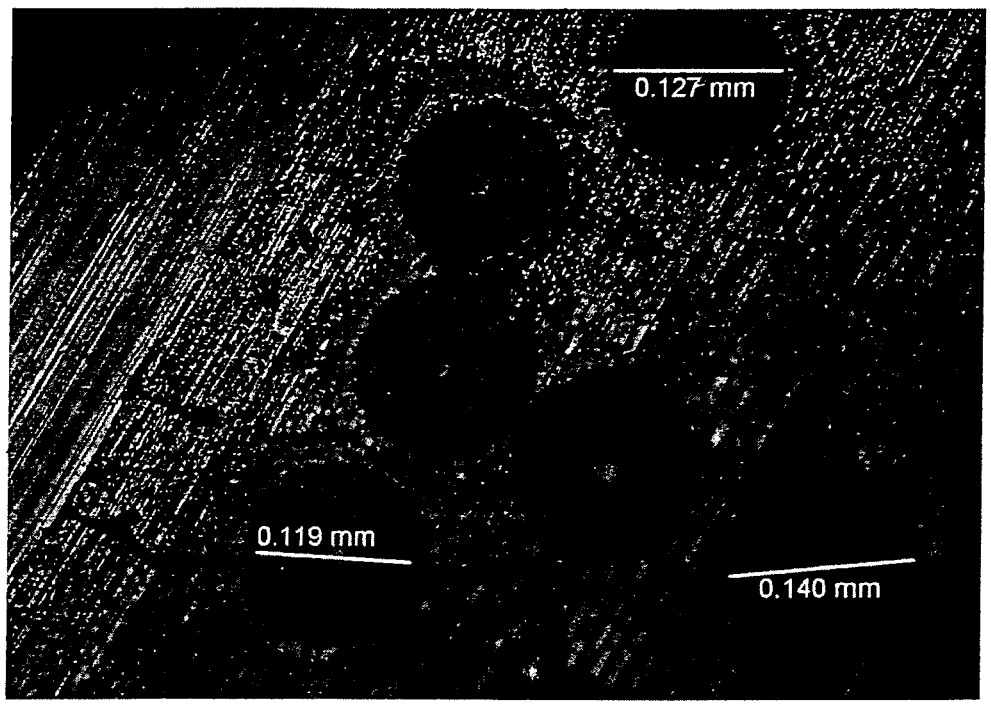
FIG. 23: 200× transverse optical micrograph showing some reaction products at the interface between boron nitride coated boron fiber (with a tungsten core) and the magnesium matrix near the iron crucible wall. Other fibers are very partially reacted or completely unreacted.
Figure 24:
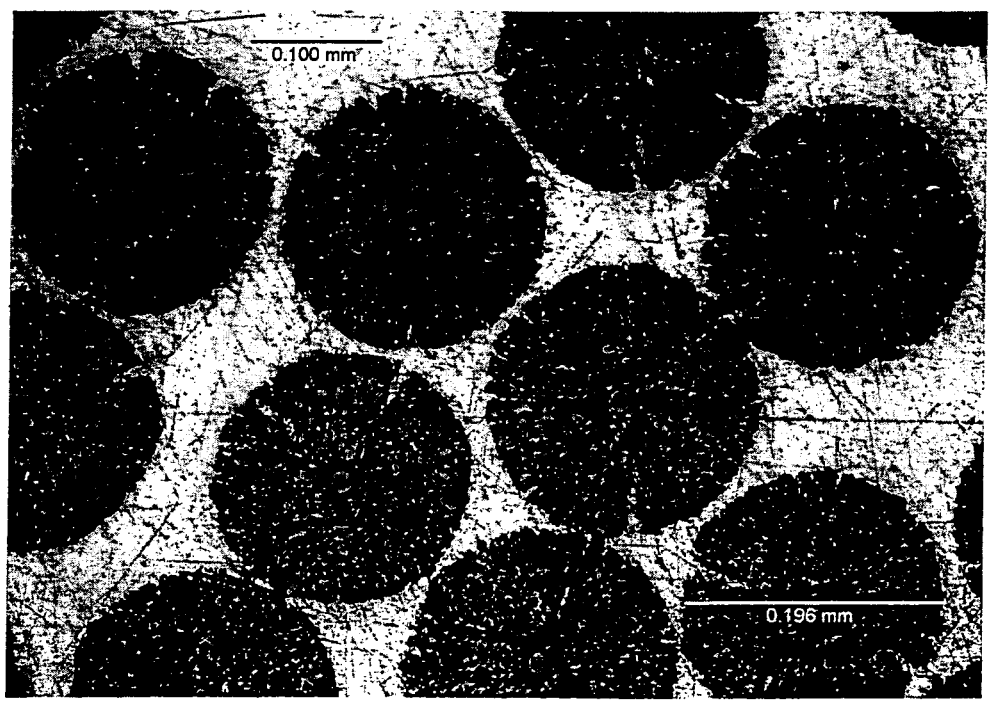
FIG. 24: 200× transverse optical micrograph of fully-reacted Mg/MgB$_2$ fiber composite, showing MgB$_2$ fibers (dark gray and yellow circles, with a central gray tungsten core) within the magnesium matrix (white). The fibers were intially boron-nitride-coated, boron fiber with 100–120 micron diameter, which have swelled to near 200 microns in diameter, as expected from the calculated volume increase as boron forms MgB$_2$.
Figure 25:
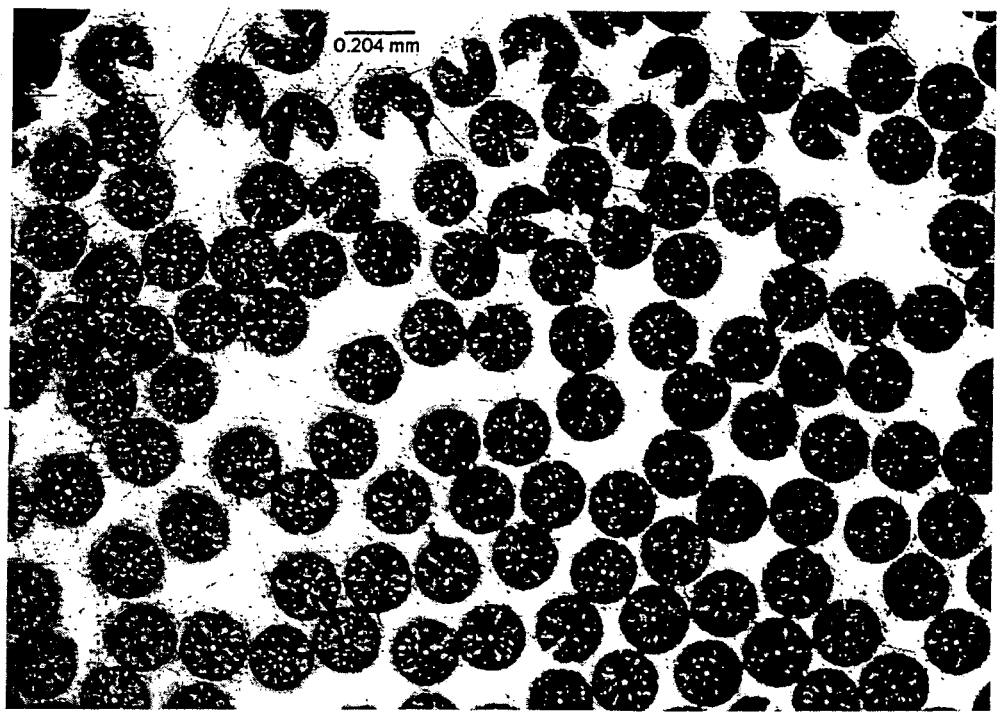
FIG. 25: 50× transverse optical micrograph of sample shown in FIG. 7. Some MgB$_2$ fibers near the crucible wall have split into pac-man like shapes as shown in the top of the micrograph.
Figure 26:
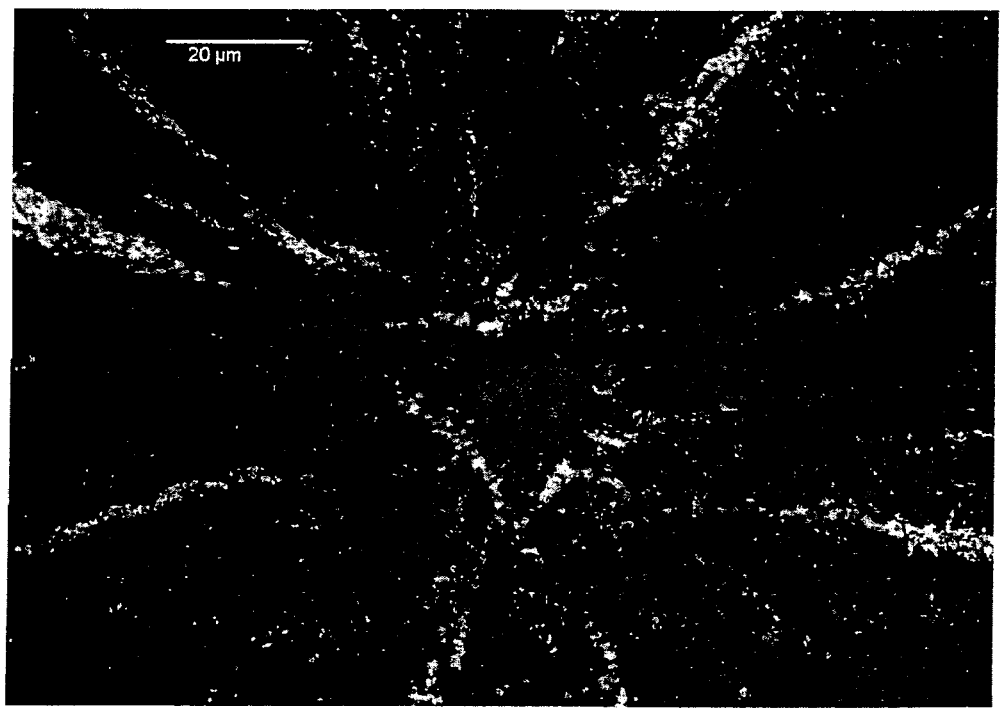
FIG. 26: 1000× transverse optical micrograph of reacted MgB$_2$ fiber, with magnesium veins (white) remaining after the reaction between liquid magnesium and boron fiber. The tungsten core of the original boron fiber also appears to have reacted and changed shape after the 2 hours at 950° C. heat treatment immediately following infiltration.
Figure 27:
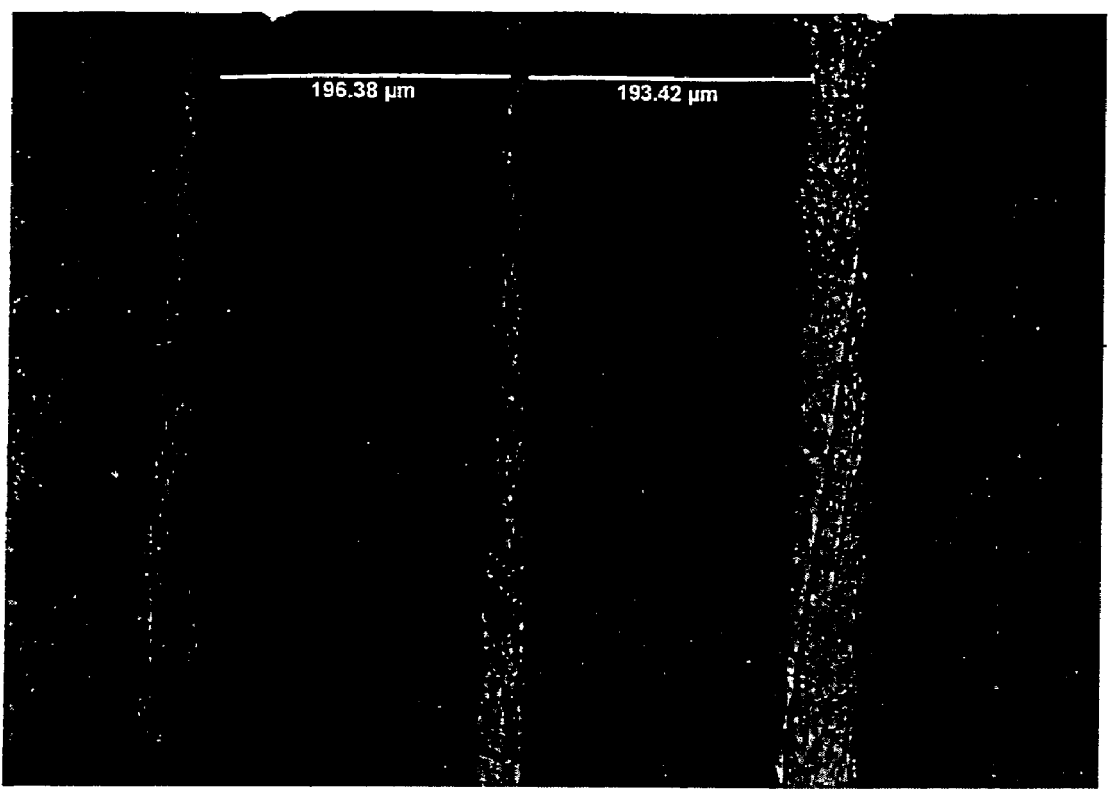
FIG. 27: 200× longitudinal optical micrograph of in-situ reacted MgB$_2$ fibers (darker phase) in a magnesium matrix (light phase). The micrograph shows pore-free and straight MgB$_2$ fibers.
Figure 28:
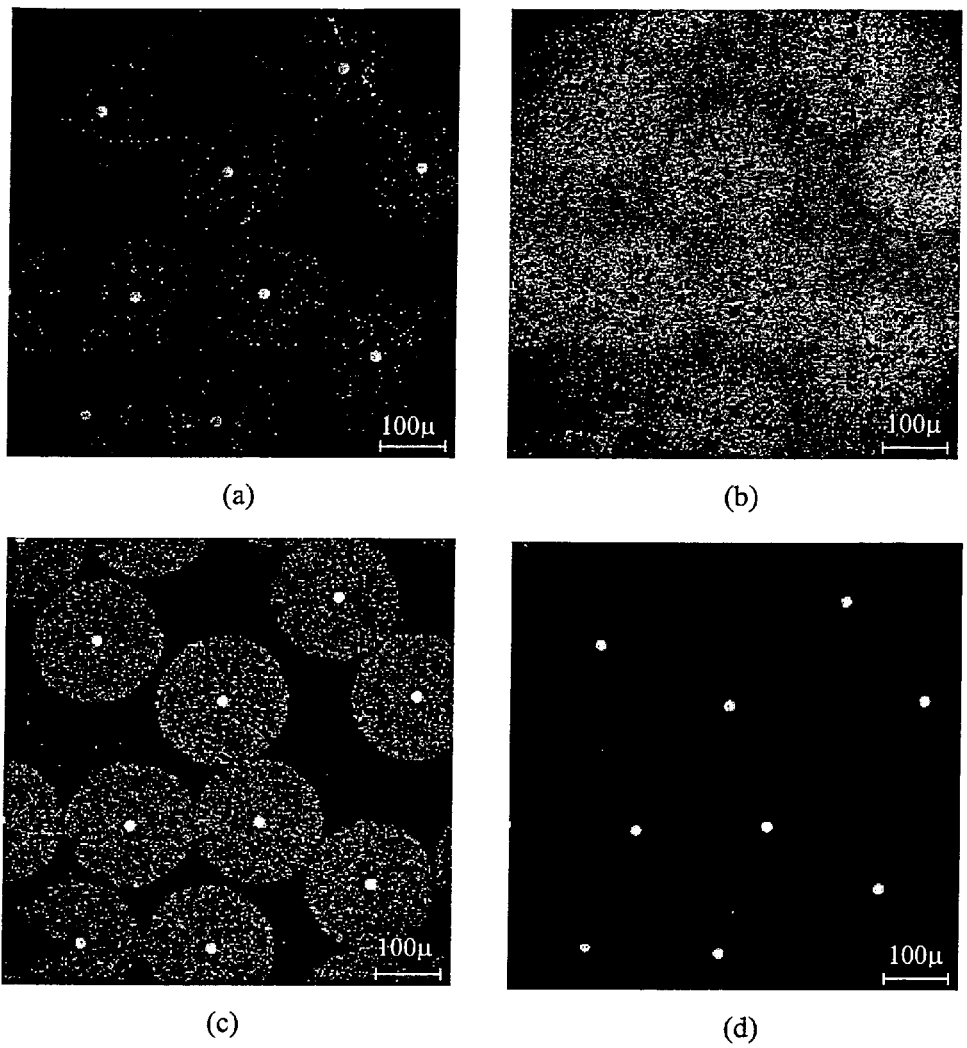
FIG. 28: Secondary Ion Mass Spectroscopy (SIMS) analysis of completely reacted Mg/MgB$_{2(f)}$ composite (transverse cut), sputter cleaned with Ga ions and analyzed at 25 keV for spatial resolution. Total ion sampling is shown in (a) with detected Mg ions are shown in (b), B ions shown in (c) and W ions in (d). The boron is completely localized to the fibers with magnesium in both matrix and fibers, showing the diffusion of magnesium into the boron and reaction at the interface with little or no boron dissolved into the magnesium.
Figure 29:
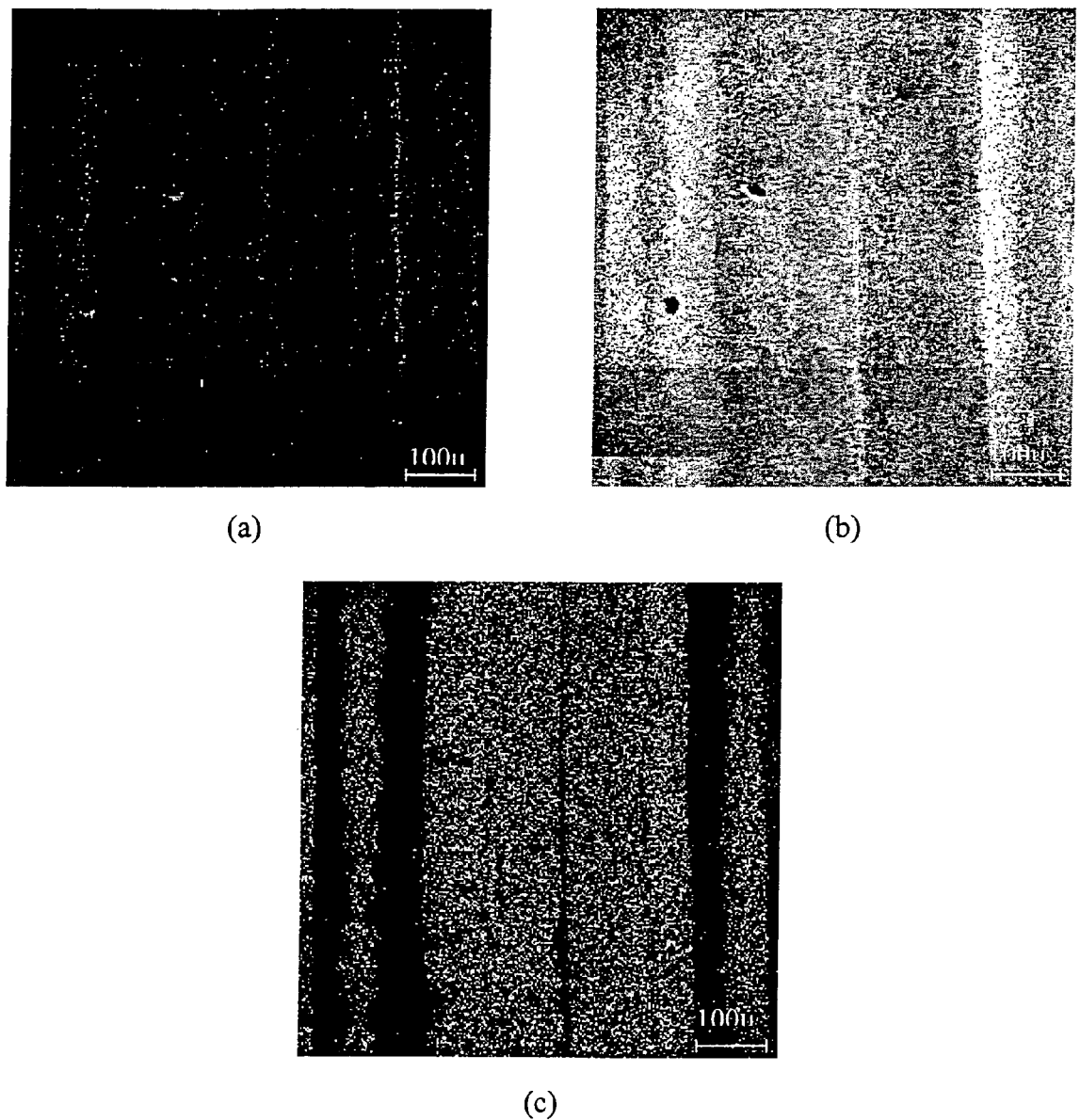
FIG. 29. Secondary Ion Mass Spectroscopy (SIMS) analysis of completely reacted Mg/MgB$_{2(f)}$ composite (longitudinal cut) and sputter cleaned with Ga ions and analyzed at 25 keV for spatial resolution. Total ion sampling is shown in (a) with detected Mg ions are shown in (b) and B ions shown in (c). The boron is completely localized to the fibers with magnesium everywhere.
Figure 30:
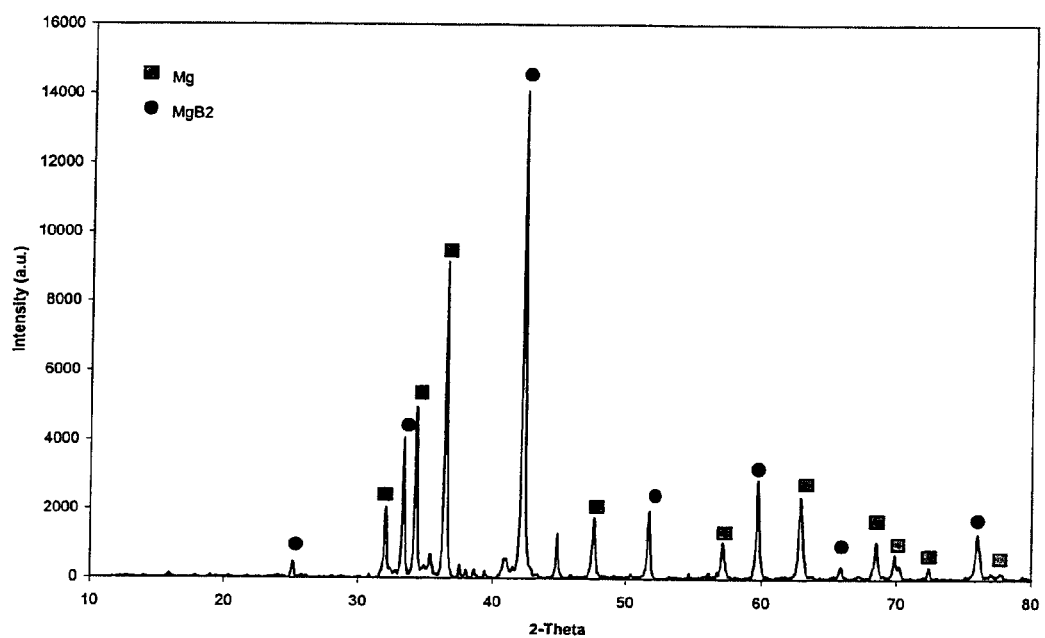
FIG. 30. X-ray diffration pattern of completely reacted Mg/MgB$_{2(f)}$ composite ground into powder for analysis. The pattern shows the dominant phases are magnesium and MgB$_2$ confirming the reacted fibers in the matrix are MgB$_2$ and should have superconducting properties. There are some minor unknown phases between 36° and 42° and around 44° that have not been identified. These phases could be oxidation products or tungsten-boride phases.

The second attempt to react the boron fibers involved using boron fibers (tungsten core and coated with a very thin layer of boron-nitride, 120–140 micron in diameter) cut to 25 mm in length and aligned in a 10 mm diameter iron crucible. The fibers were aligned and infiltrated with magnesium using the same procedure as above at 800° C.; no reaction was observed between the fibers and Mg (FIG. 22). The sample was then held at 800° C. under 3.2 MPa of argon for 2 hours and then cooled under pressure. A slight reaction product, most probably $MgB_2$ was observed (FIG. 23).

Example 25

A third in-situ fiber reaction experiment again used the same nitride-coated boron fibers cut to 25 mm length and aligned in an iron crucible. Immediately following infiltration at 800° C., the 3.2 MPa of argon pressure was evacuated to between 100 and 200 kPa of argon pressure so the furnace could be heated to 950° C. The infiltrated fibers were held at 950° C. for two hours. The furnace was then pressurized to about 1.5 MPa before cooling under directional solidification conditions. Results are shown in FIGS. 24–30, and indicate complete reaction of the boron fibers into $MgB_2$ fibers, with a near circular cross-section and excellent longitudinal straightness, unlike results reported in the literature, where boron fibers are reacted with Mg vapors, leading to highly bent shapes. A pore-free matrix of Mg surrounds the $MgB_2$ fibers. Boron nanofibers, as well as other precursor fiber components known to those skilled in the art made aware of this invention, are also contemplated for use in conjunction with the present invention.

Example 26

The materials/composites of this example are prepared according to the procedure described in example 1 or example 5 modified as otherwise described herein, with a configured preform including at least one of the following components:
a) $MgB_2$ powders or fibers.
b) $MgB_2$ fibers sheathed with Ta or Fe.
c) boron-containing precursor in powder in powder or fiber form.
d) boron (powder or fibers). as well as at least one of the following components:
e) steel fibers.
f) graphite (particles, fibers or tubules).
g) alumina (particles, platelets or fibers).

The fibers of preforms a–g can be arranged directionally or by way of planar orientation to provide composite anisotropy, especially with regard to direction of current conductivity.

Example 27

The preforms of example 6 preferably infiltrated with liquid Ag, Al, Zn or alloys thereof, are optionally contacted with liquid Cu, Sn or alloys thereof, providing materials/composites with alternate metal matrices, in accordance with this invention.

Example 28

Preforms useful with the present invention include those comprising a) boron (fibers or particles, amorphous or crystalline), b) boron oxide and/or c) other magnesium diboride precursors—optionally in the presence of solid magnesium metal mixed within the preform. $MgB_2$ is prepared in situ as the reaction product of preforms a)–c) with d) liquid Mg metal or alloy, or e) Mg metal originally mixed in the preform which is infiltrated with another suitable metal such as, but not limited to, Zn which is non-reactive in the context of the in situ $MgB_2$ synthesis.

Alternatively, such preforms can be prepared with components a), b) and/or c), reactive with liquid magnesium metal introduced to or infiltrated therein, and resulting in $MgB_2$ as an in situ reaction product. As a further variation, the liquid component can be another suitable metal non-reactive with the preform components or the resulting $MgB_2$ phase.

While the principles of this invention have been described in connection with specific embodiments, it should be understood clearly that these descriptions are added only by way of example and are not intended to limit, in any way, the scope of this invention. Other advantages and features will become apparent from the claims provided below, with the scope thereof determined by their reasonable equivalents, as would be understood by those skilled in the art.

The invention claim is:

1. A superconducting magnesium diboride composite, comprising a superconducting magnesium-boride phase component and a metallic phase component, said composite obtainable from a porous magnesium boride preform component, said preform component comprising magnesium and boron, and introduction of a metallic component into said pores of said preform component, said introduction with at least one of temperature and pressure sufficient to infiltrate said preform, said metallic component selected from the group consisting of metals, alloys and combinations thereof, said metallic component having a melting point less than about 1100° C.

2. The composite of claim 1 wherein said superconducting phase component has a volume fraction greater than about 19% of said composite.

3. The composite of claim 2 wherein said superconducting phase component comprises magnesium diboride.

4. The composite of claim 3 wherein said superconducting phase has a volume fraction between about 20% and about 90% of said composite.

5. The composite of claim 4 wherein said superconducting phase component is a multi-element phase comprising magnesium and boron.

6. The composite of claim 1 wherein said metallic phase component comprises a component selected from the group consisting of metals, alloys and combinations thereof, said metallic phase component having a melting point less than about 1100° C., and said composite substantially without degradation of said superconducting phase component.

7. The composite of claim 6 wherein said metallic phase component is selected from the group consisting of magnesium metal and a magnesium alloy, and said superconducting phase component comprises magnesium diboride, said superconducting phase component having a volume fraction greater than about 19% of said composite.

8. The composite of claim 7 further including a non-superconducting phase to enhance composite function.

9. A superconducting composite comprising a magnesium diboride superconducting phase component and a magnesium phase component, said magnesium diboride superconducting phase having a volume fraction greater than about 19% of said composite.

10. The composite of claim 9 wherein said superconducting magnesium diboride phase is a multi-element phase comprising magnesium and boron.

11. A composite of claim 9 wherein said superconducting phase has a volume fraction between about 20% and about 90% of said composite.

12. The composite of claim 9 wherein said magnesium phase is a magnesium alloy including another metallic component selected from the group consisting of metals, alloys and combinations thereof, said other metallic component having a melting point less than about 1100° C. and said composite substantially without degradation of said superconducting phase.

13. The composite of claim 9 further including a non-superconducting phase to enhance composite function, said non-superconducting phase at least one of graphite, a metal, a ceramic, and a polymer material.

14. The composite of claim 9 wherein said magnesium diboride superconducting phase comprises substantially straight aligned fibers.

15. The composite of claim 9 having a preformed configuration.

* * * * *

UNITED STATES PATENT AND TRADEMARK OFFICE
CERTIFICATE OF CORRECTION

PATENT NO. : 6,995,119 B2
APPLICATION NO. : 10/680639
DATED : February 7, 2006
INVENTOR(S) : David C. Dunand It is certified that error appears in the above-identified patent and that said Letters Patent is hereby corrected as shown below:

Col. 7, Line 9: "polyethylene," should be --(polyethylene,--

Col. 9, Line 41: "Level" should be --level--

Col. 12, Line 23: Remove --treatment particles--

Signed and Sealed this

Eighth Day of August, 2006

JON W. DUDAS
*Director of the United States Patent and Trademark Office*